United States Patent
Liu et al.

(10) Patent No.: US 9,780,112 B2
(45) Date of Patent: Oct. 3, 2017

(54) METHODS AND APPARATUS FOR THREE-DIMENSIONAL NAND NON-VOLATILE MEMORY DEVICES WITH SIDE SOURCE LINE AND MECHANICAL SUPPORT

(71) Applicant: SanDisk Technologies Inc., Plano, TX (US)

(72) Inventors: Jin Liu, Fremont, CA (US); Chun Ge, San Jose, CA (US); Johann Alsmeier, San Jose, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 14/922,365

(22) Filed: Oct. 26, 2015

(65) Prior Publication Data

US 2017/0117289 A1    Apr. 27, 2017

(51) Int. Cl.
| | |
|---|---|
| H01L 27/11 | (2006.01) |
| H01L 27/11582 | (2017.01) |
| H01L 27/1157 | (2017.01) |
| H01L 27/11529 | (2017.01) |
| H01L 27/11556 | (2017.01) |
| H01L 27/11573 | (2017.01) |

(52) U.S. Cl.
CPC .... *H01L 27/11582* (2013.01); *H01L 27/1157* (2013.01); *H01L 27/11529* (2013.01); *H01L 27/11556* (2013.01); *H01L 27/11573* (2013.01)

(58) Field of Classification Search
CPC .......... H01L 27/1157; H01L 27/11582; H01L 27/11556; H01L 27/11573
See application file for complete search history.

(56) References Cited

U.S. PATENT DOCUMENTS

| | | |
|---|---|---|
| 2010/0163968 A1 | 7/2010 | Kim et al. |
| 2010/0320528 A1 | 12/2010 | Jeong et al. |
| 2013/0272069 A1* | 10/2013 | Rabkin ............... H01L 29/6675 365/185.17 |
| 2015/0206587 A1 | 7/2015 | Hasegawa et al. |
| 2015/0255481 A1 | 9/2015 | Baenninger et al. |

OTHER PUBLICATIONS

International Search Report and Written Opinion dated Feb. 7, 2017 in International Patent Application No. PCT/US2016/051355.

* cited by examiner

*Primary Examiner* — Douglas Menz
(74) *Attorney, Agent, or Firm* — Vierra Magen Marcus LLP

(57) ABSTRACT

A method of fabricating a monolithic three dimensional memory structure is provided. The method includes forming a stack of alternating word line and dielectric layers above a substrate, forming a source line above the substrate, forming a memory hole extending through the alternating word line and dielectric layers and the source line, and forming a mechanical support element on the substrate adjacent to the memory hole.

10 Claims, 43 Drawing Sheets

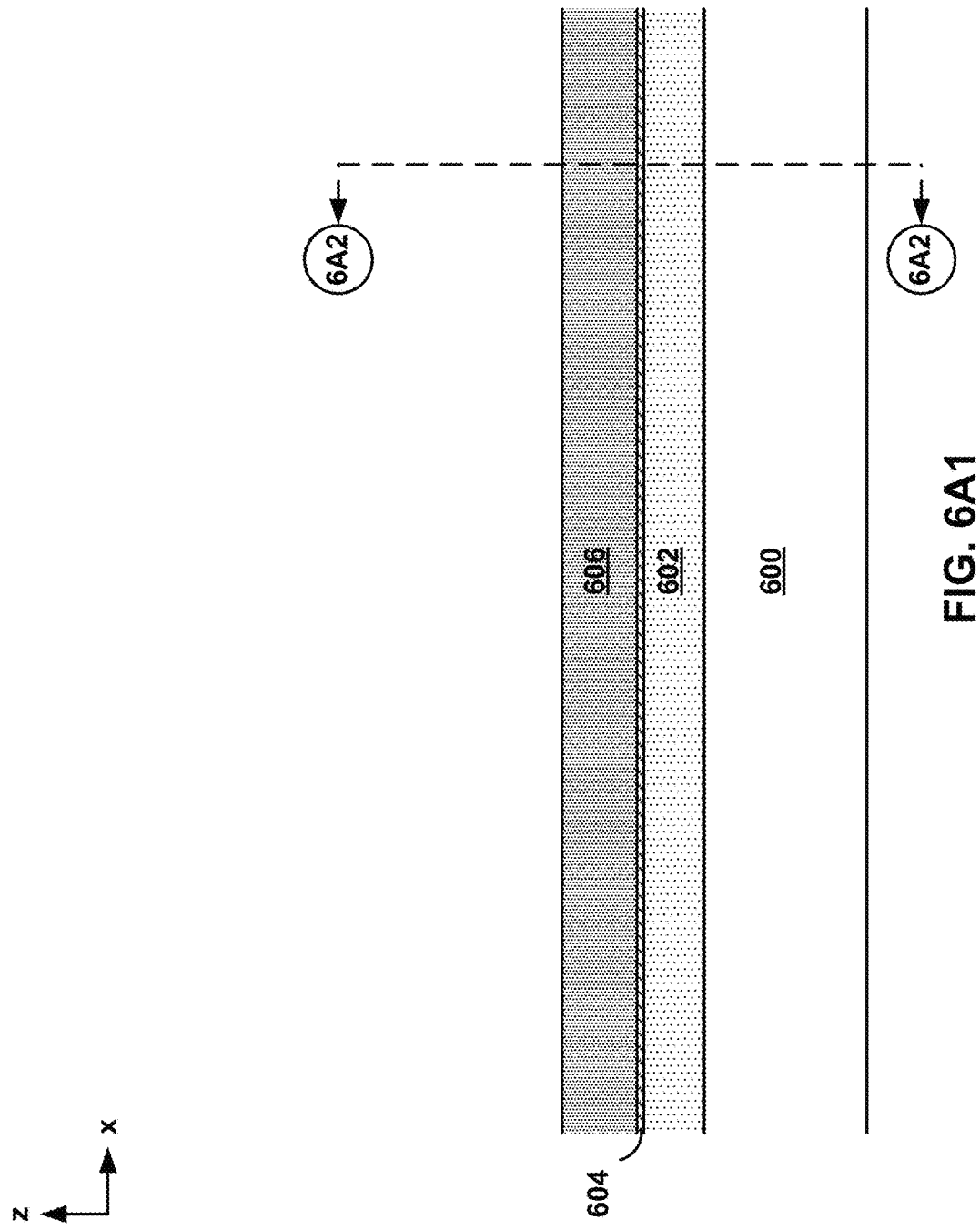

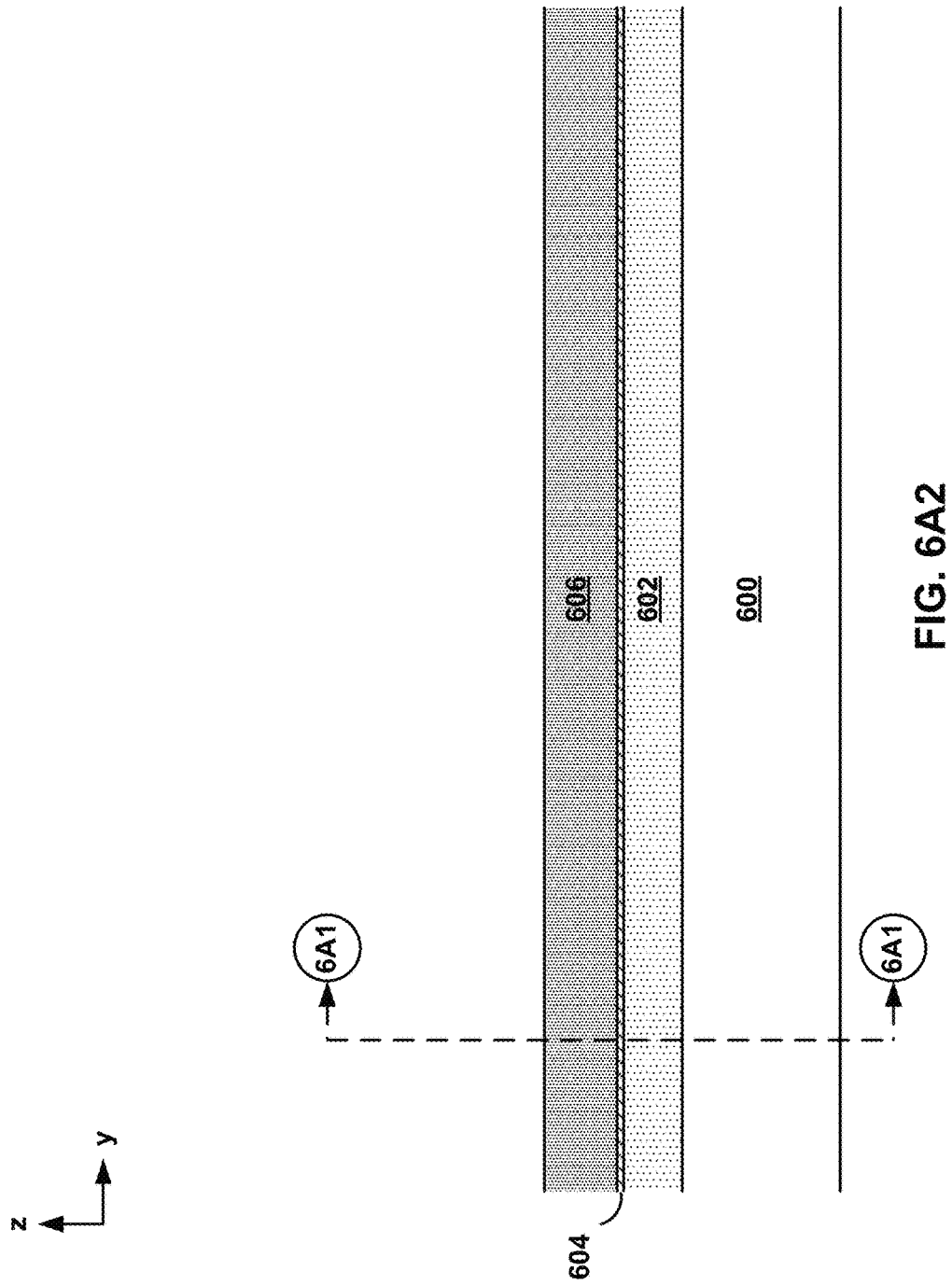

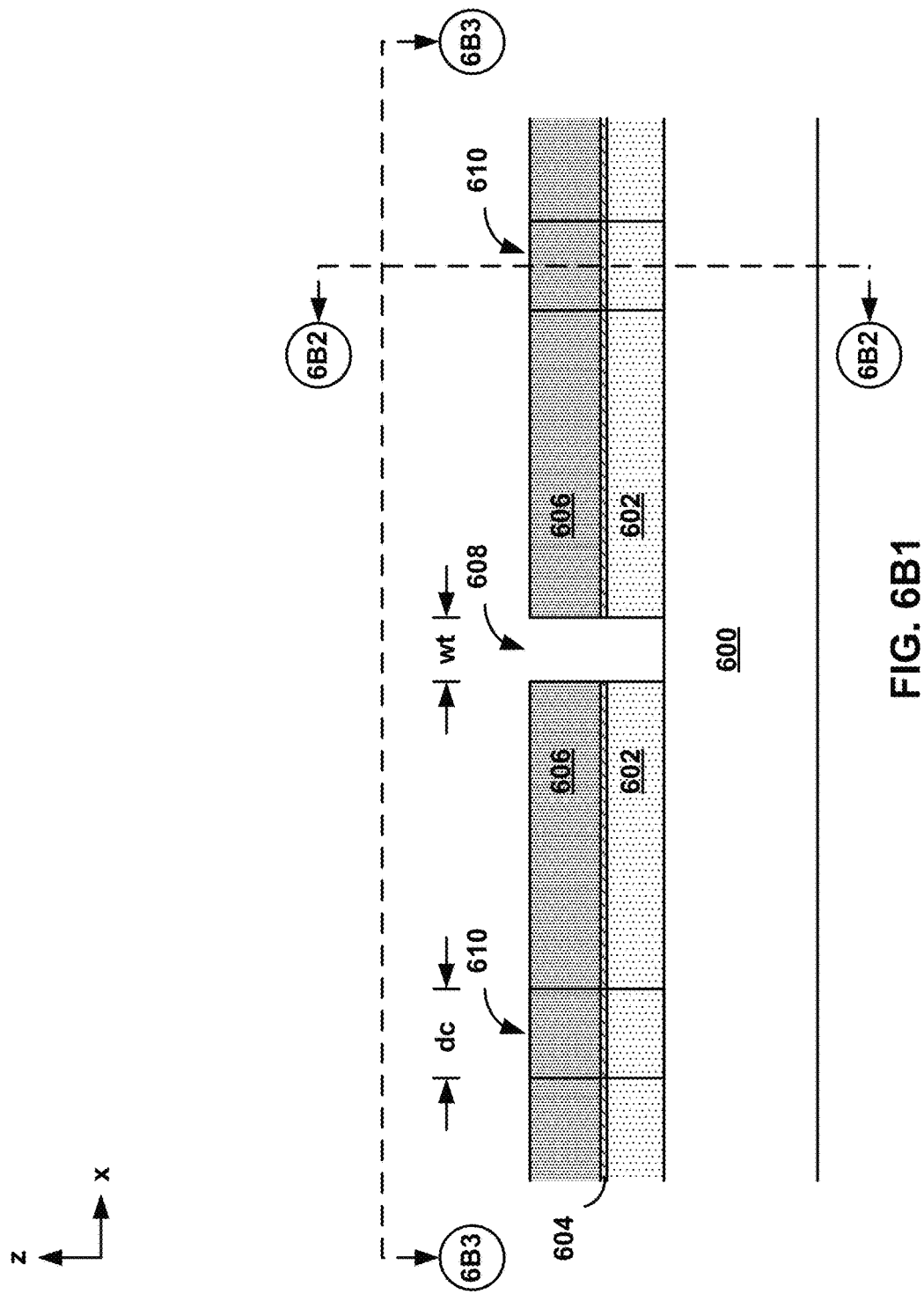
FIG. 6B1

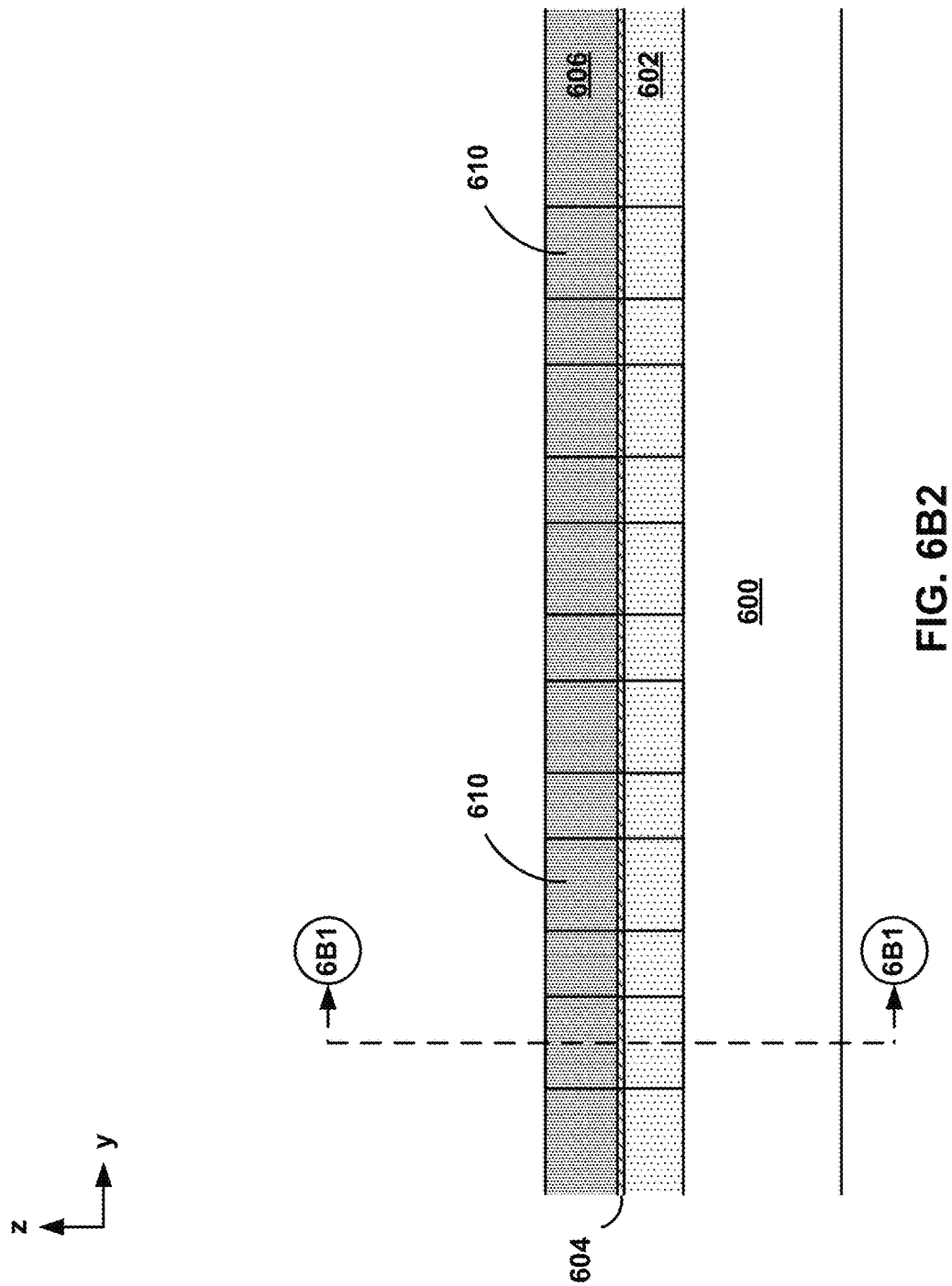
FIG. 6B2

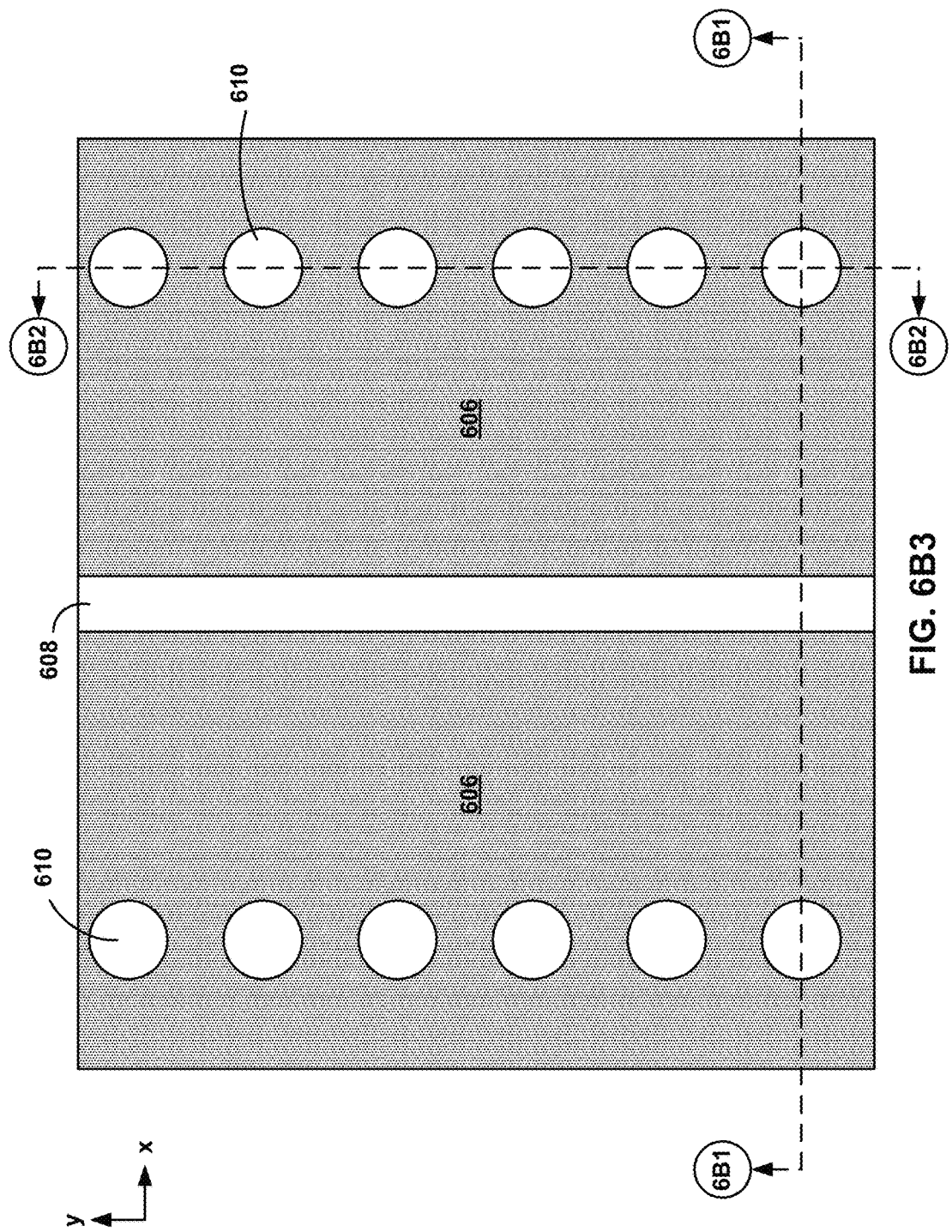

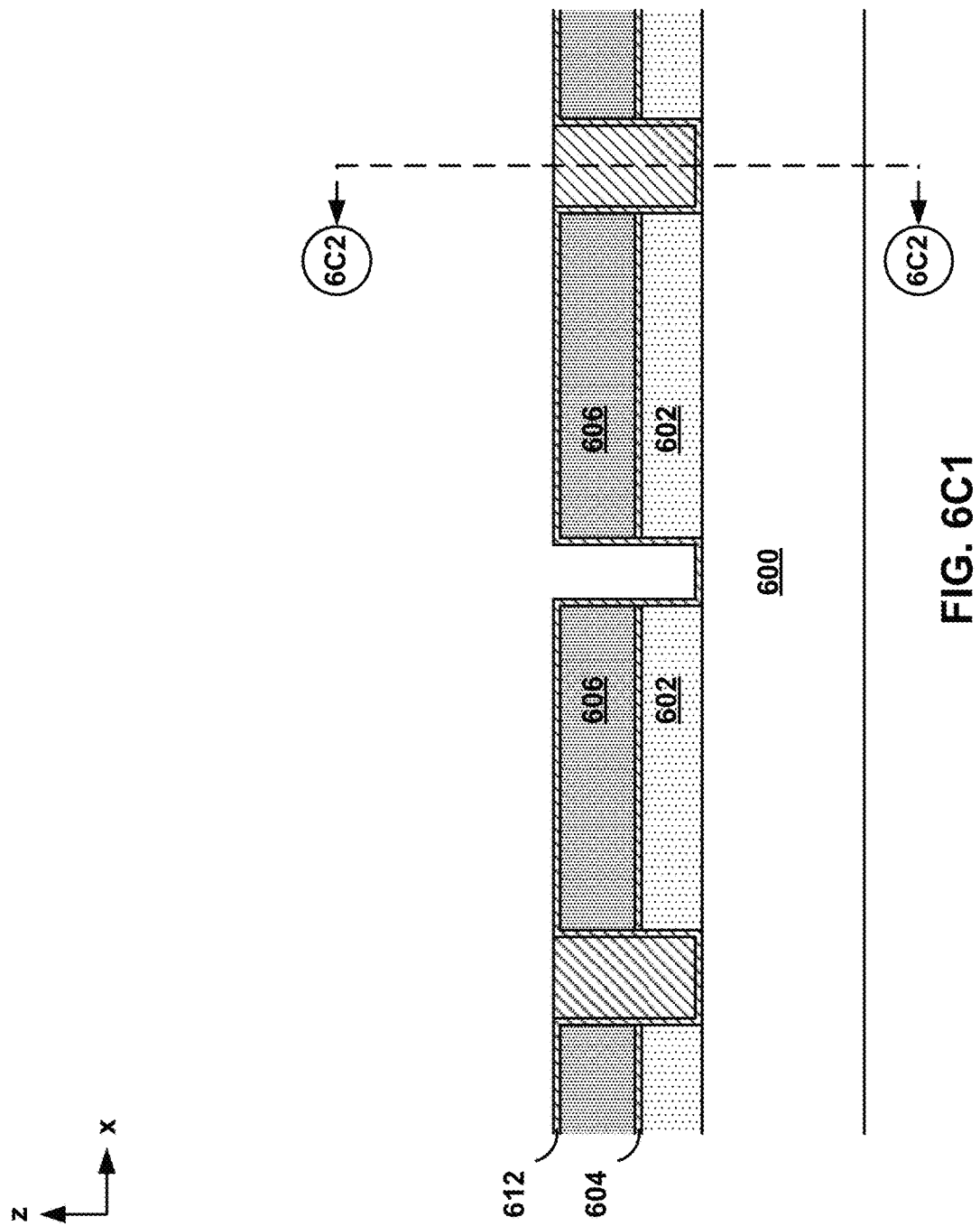

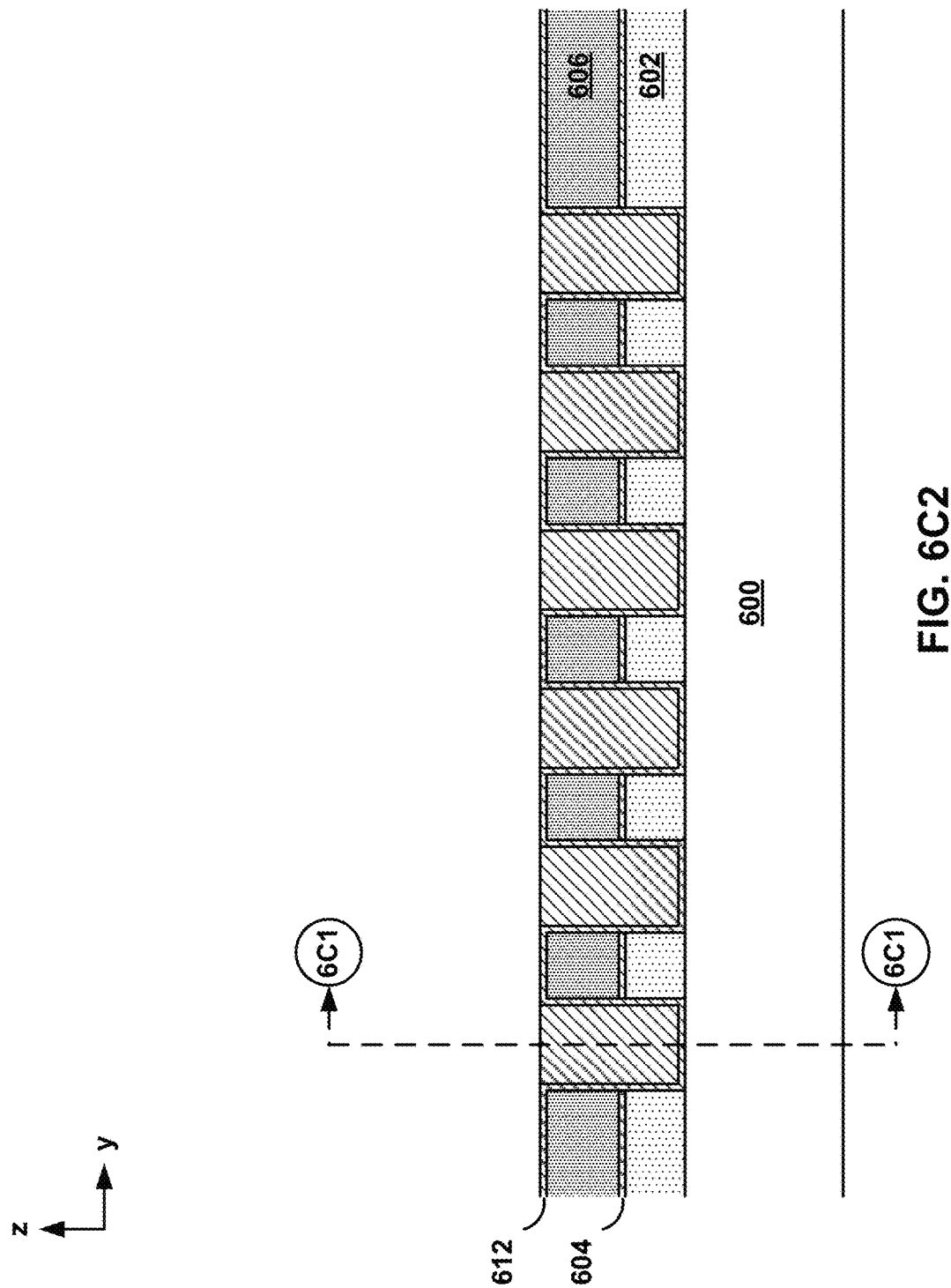
FIG. 6C2

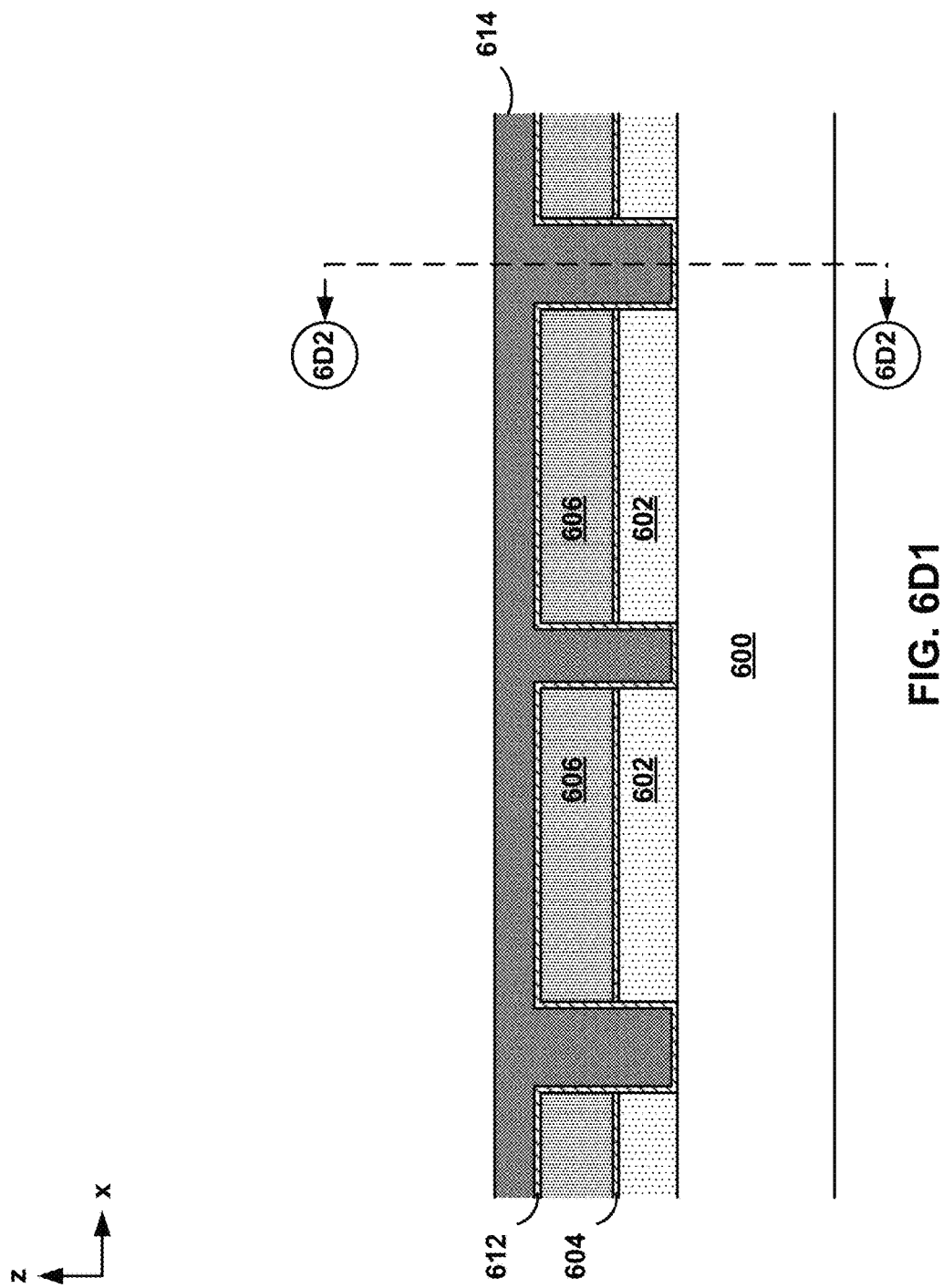
FIG. 6D1

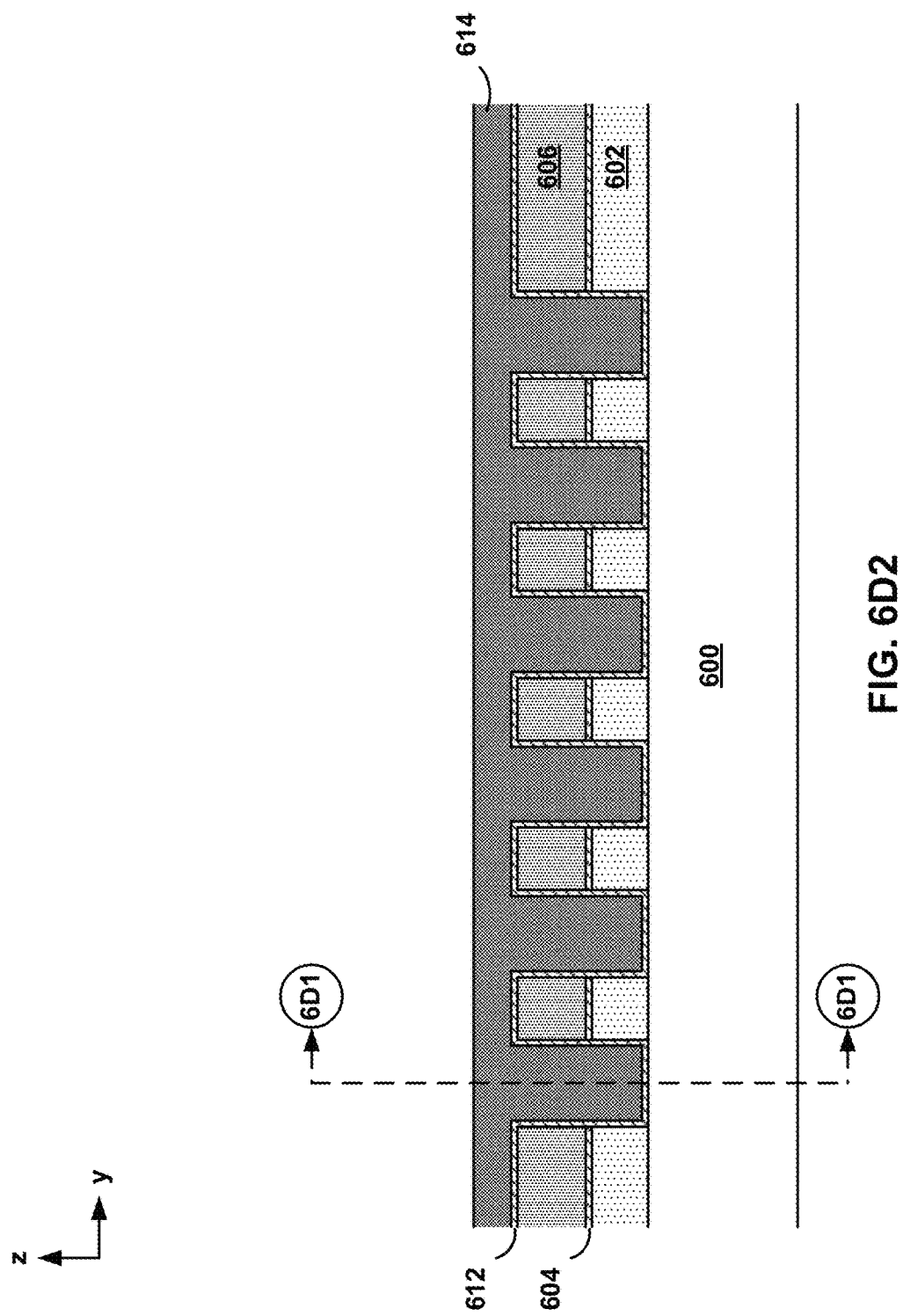

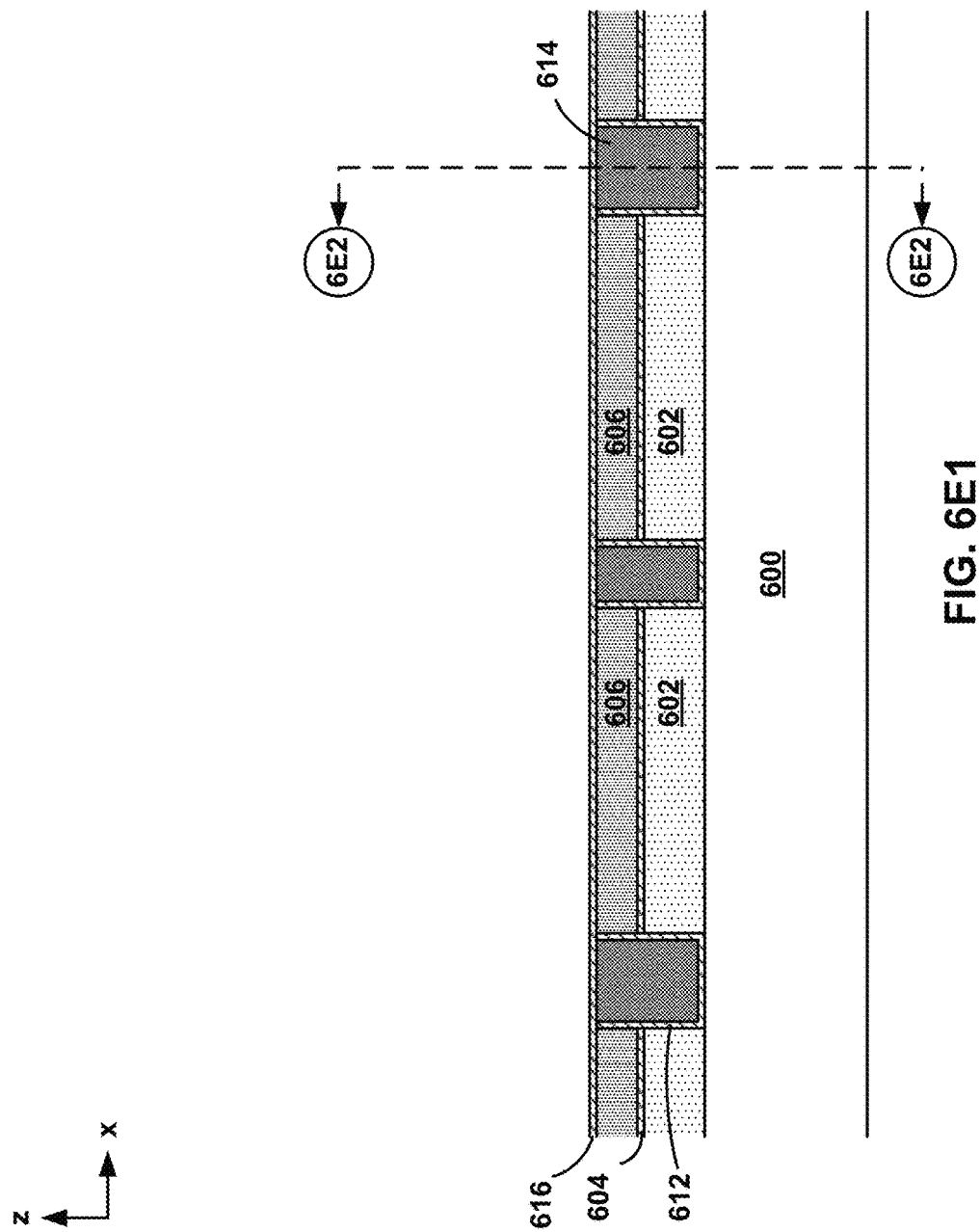
FIG. 6E1

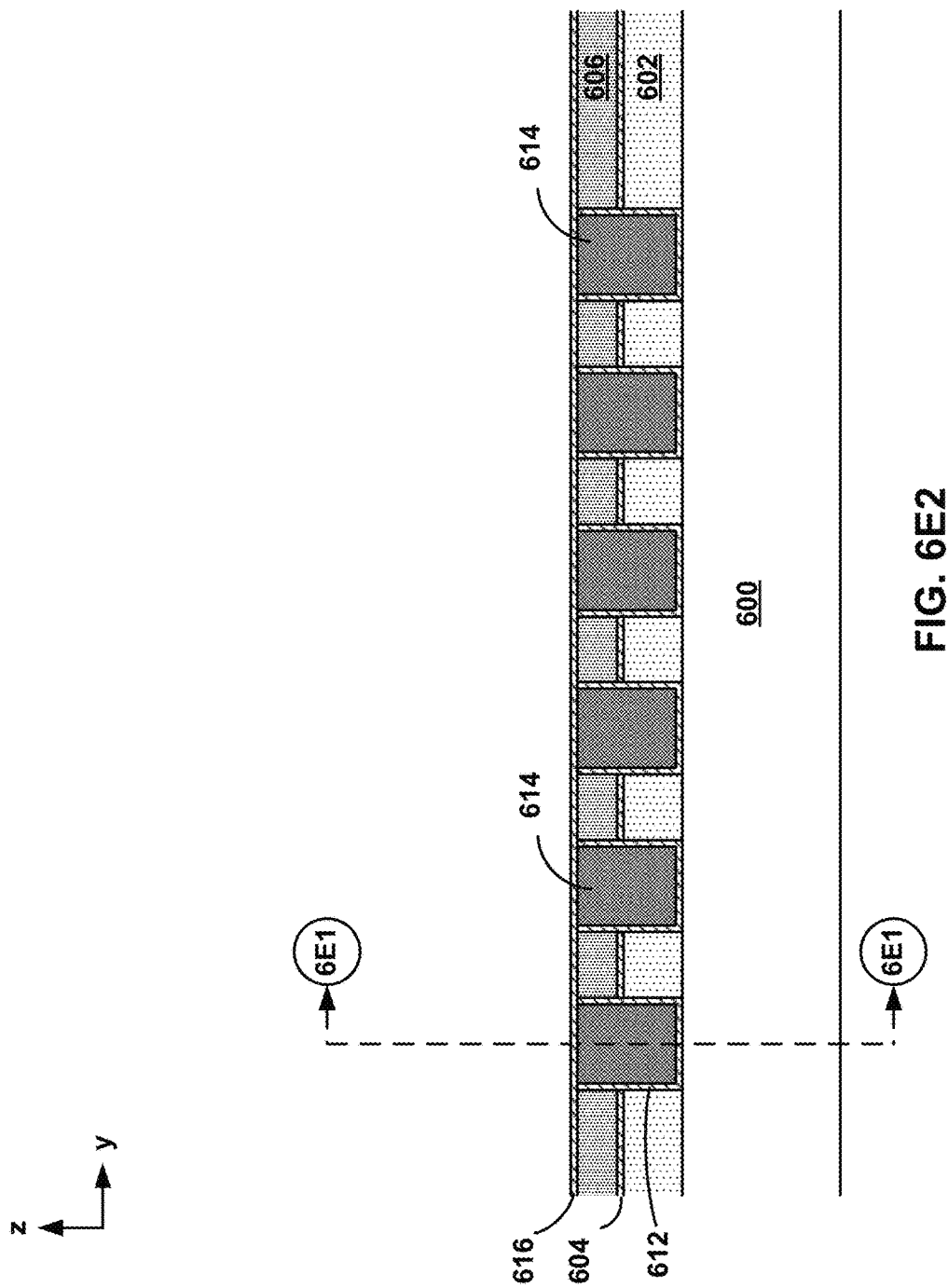
FIG. 6E2

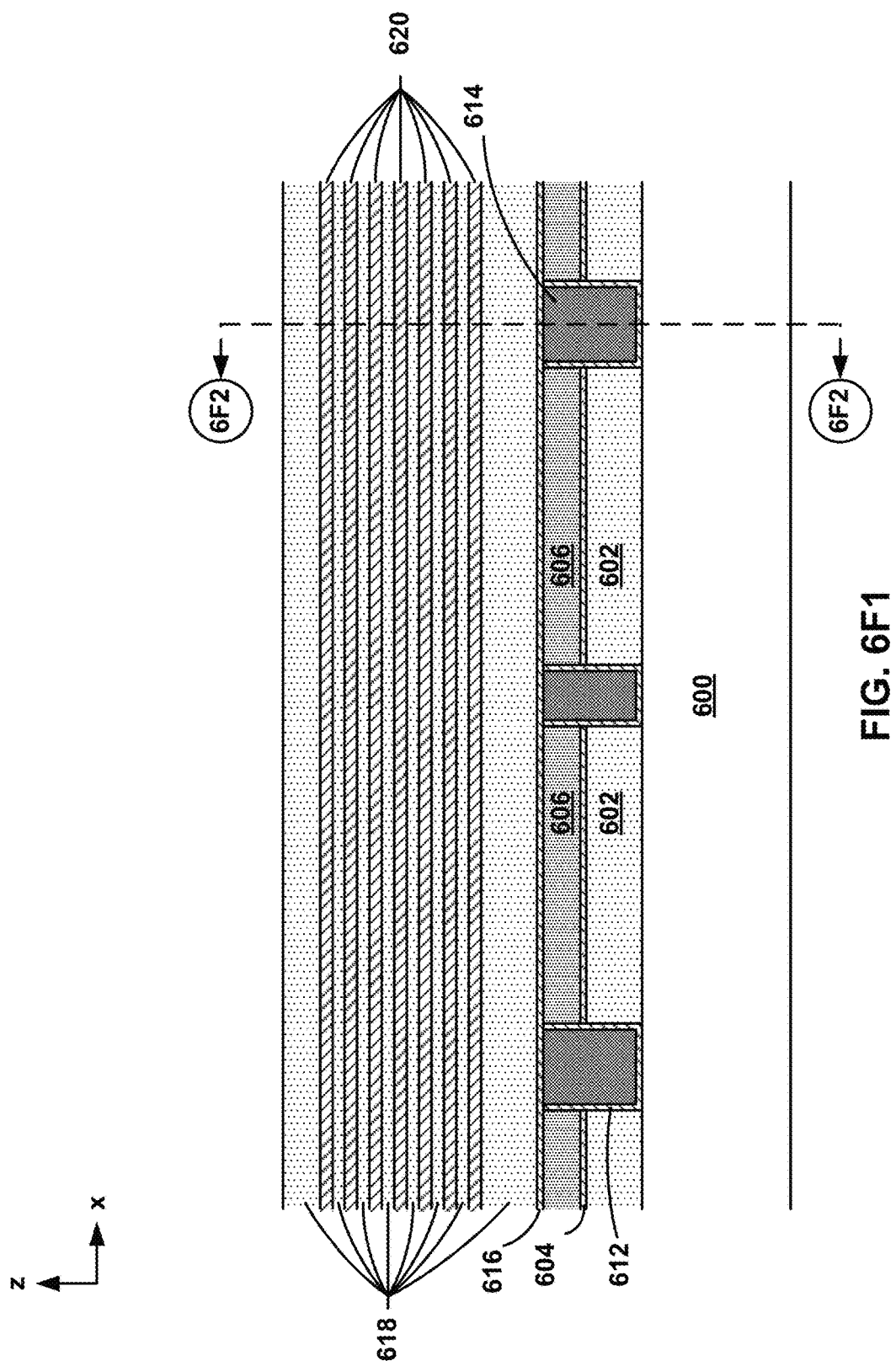
FIG. 6F1

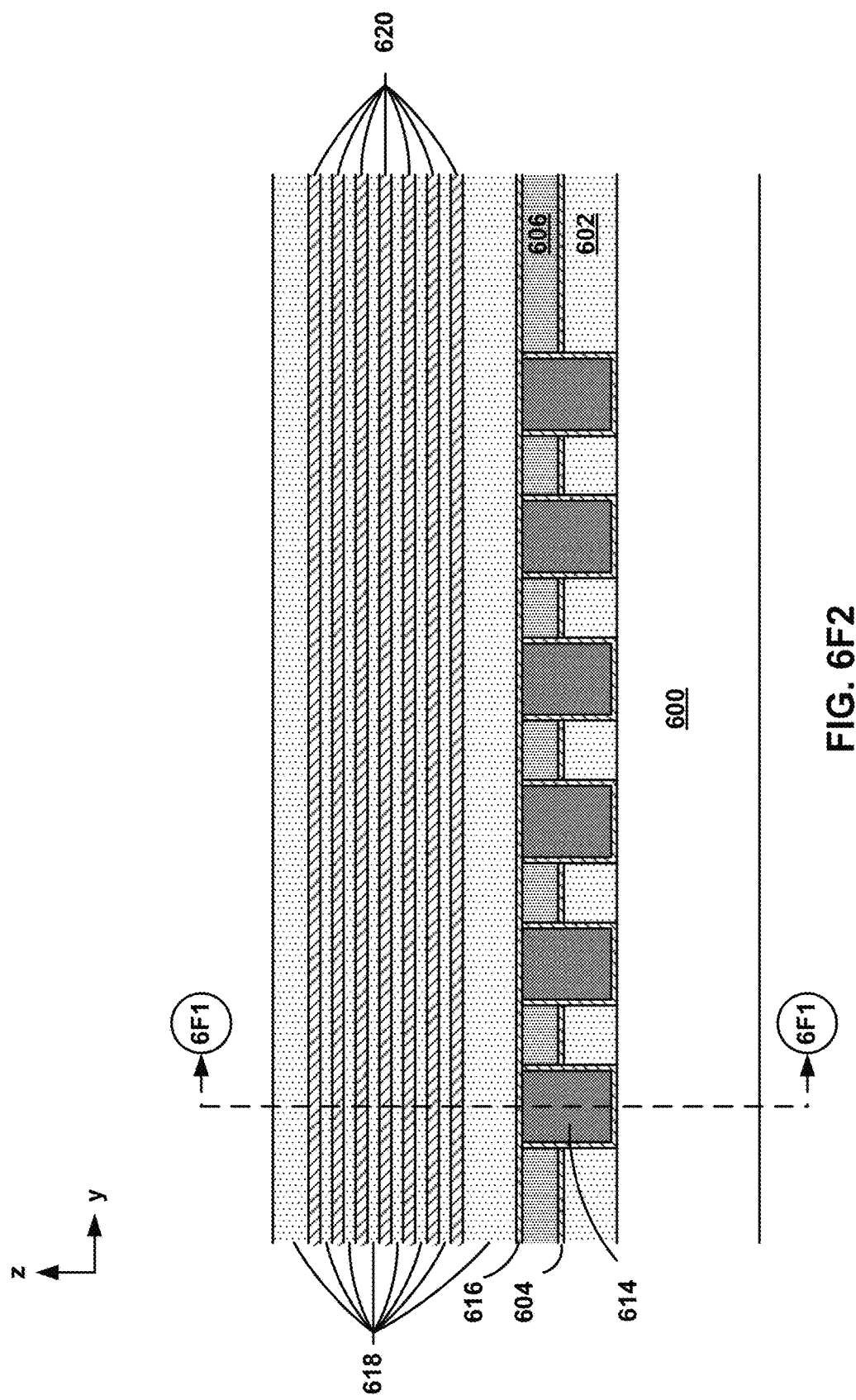
FIG. 6F2

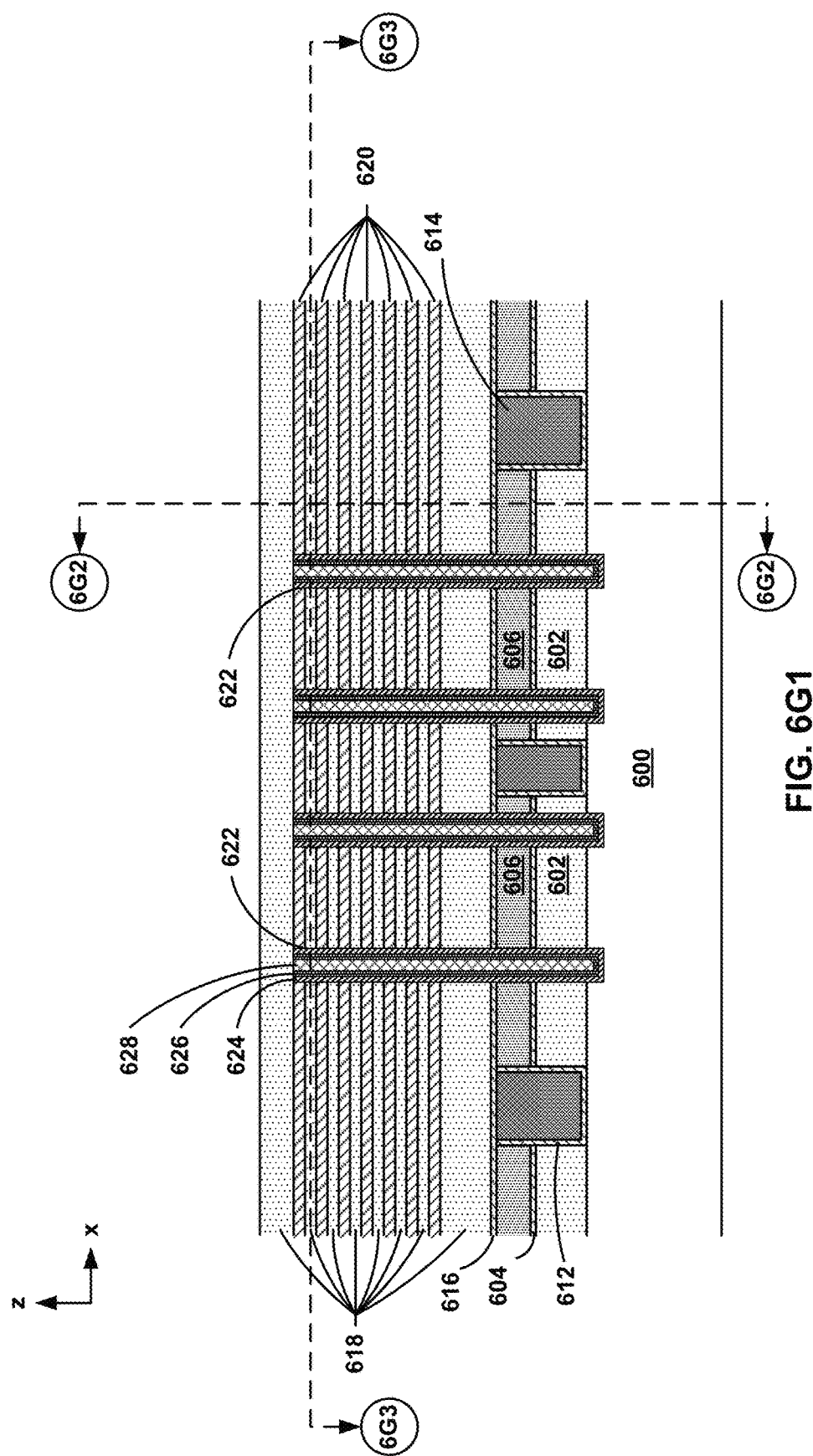
FIG. 6G1

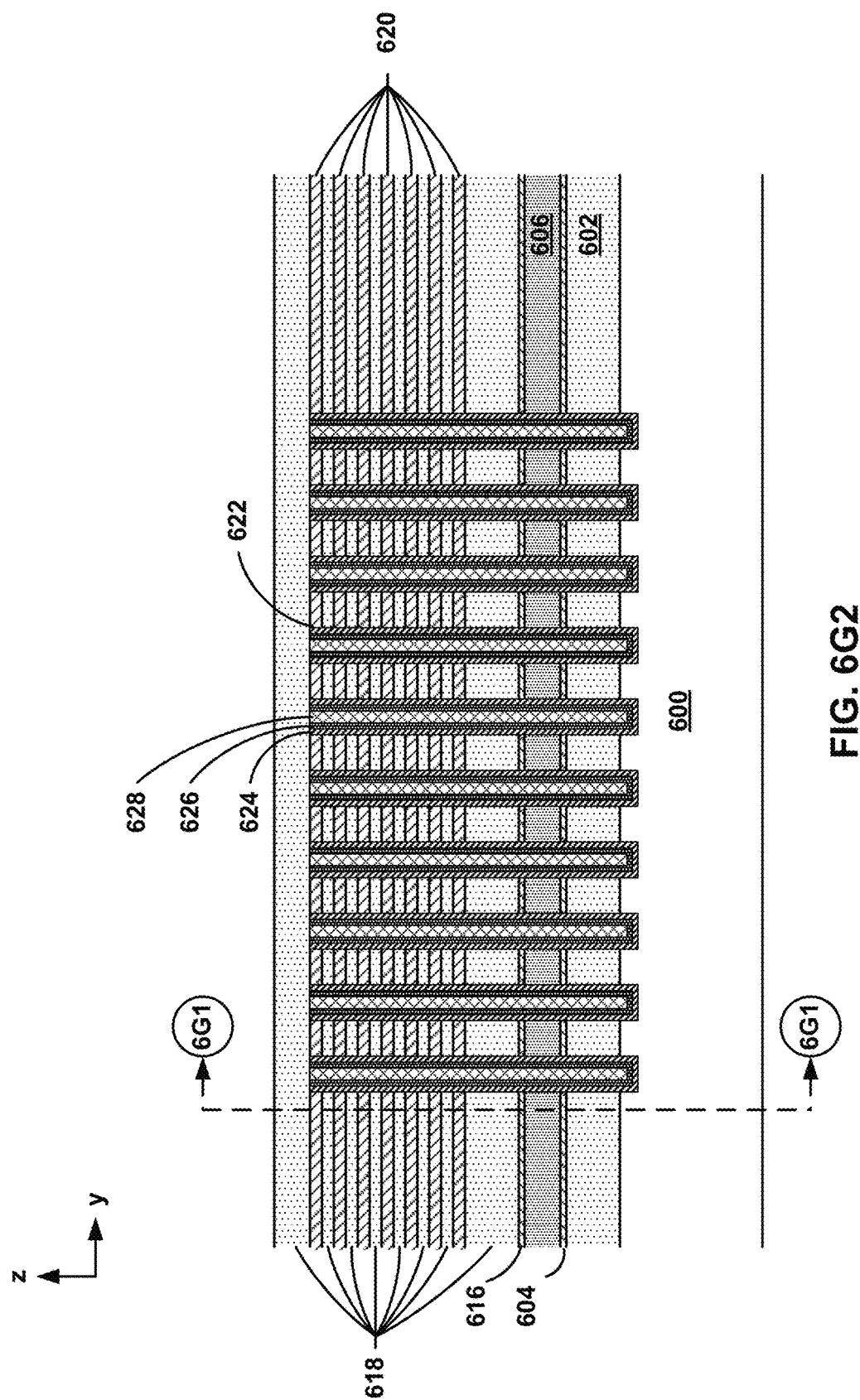
FIG. 6G2

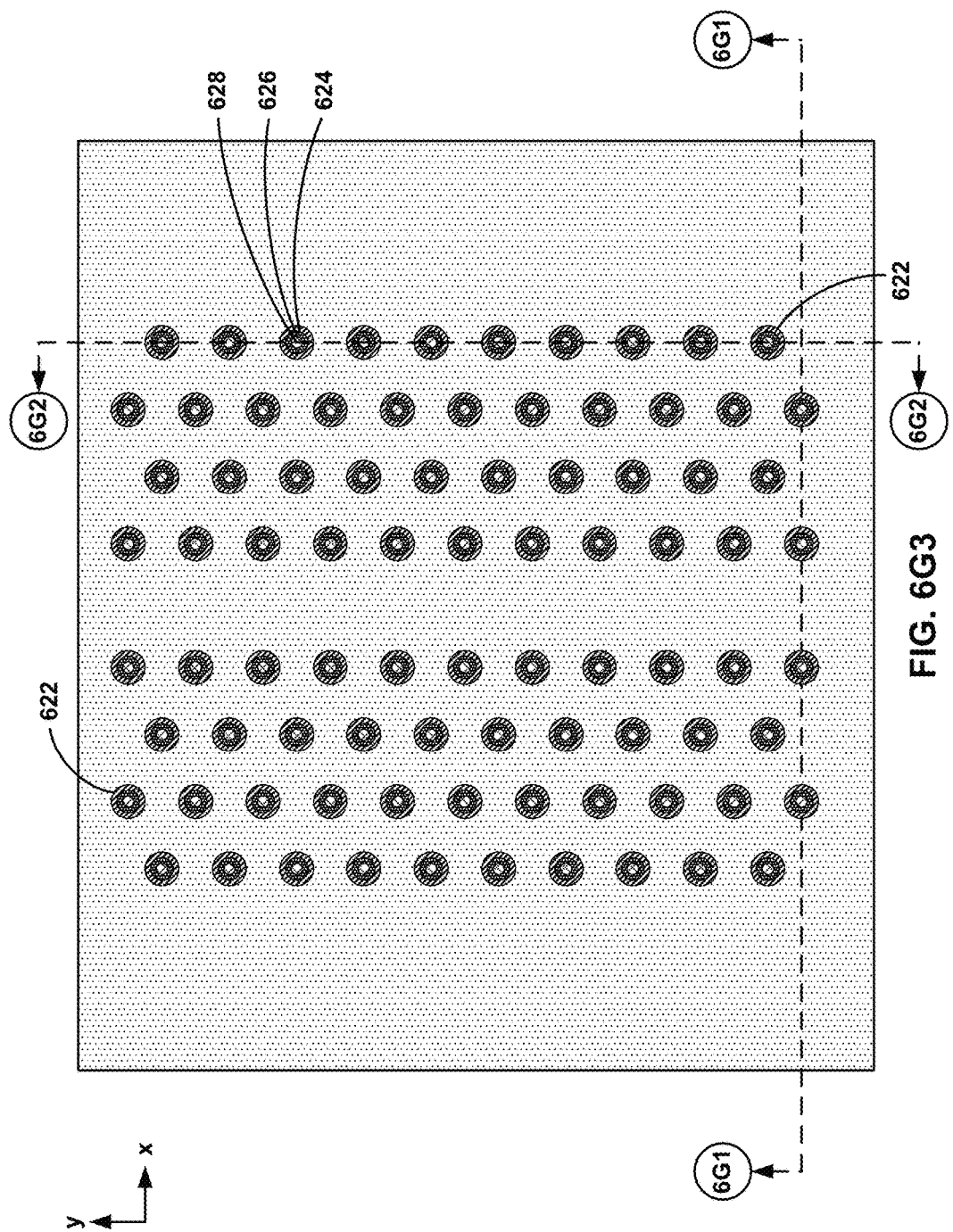
FIG. 6G3

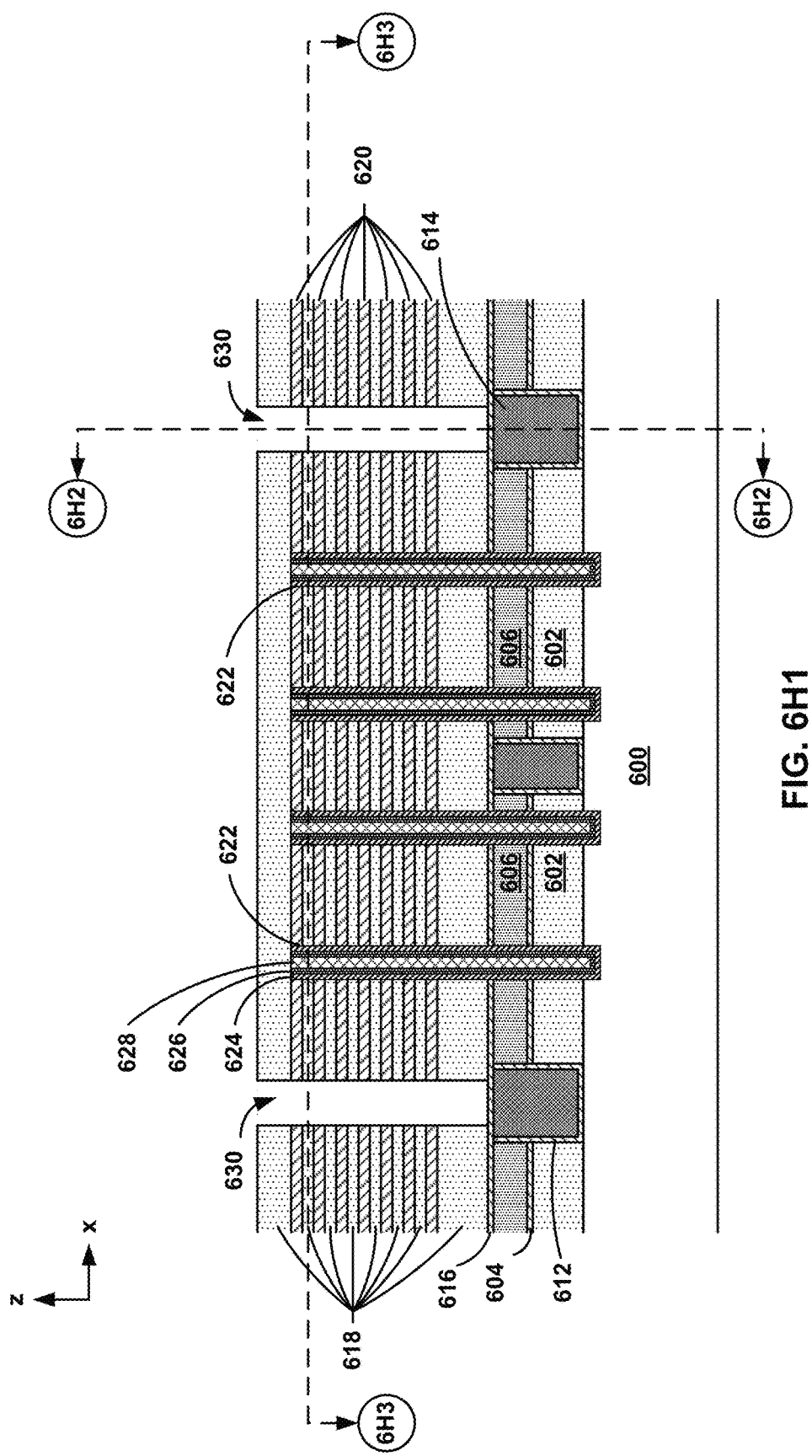

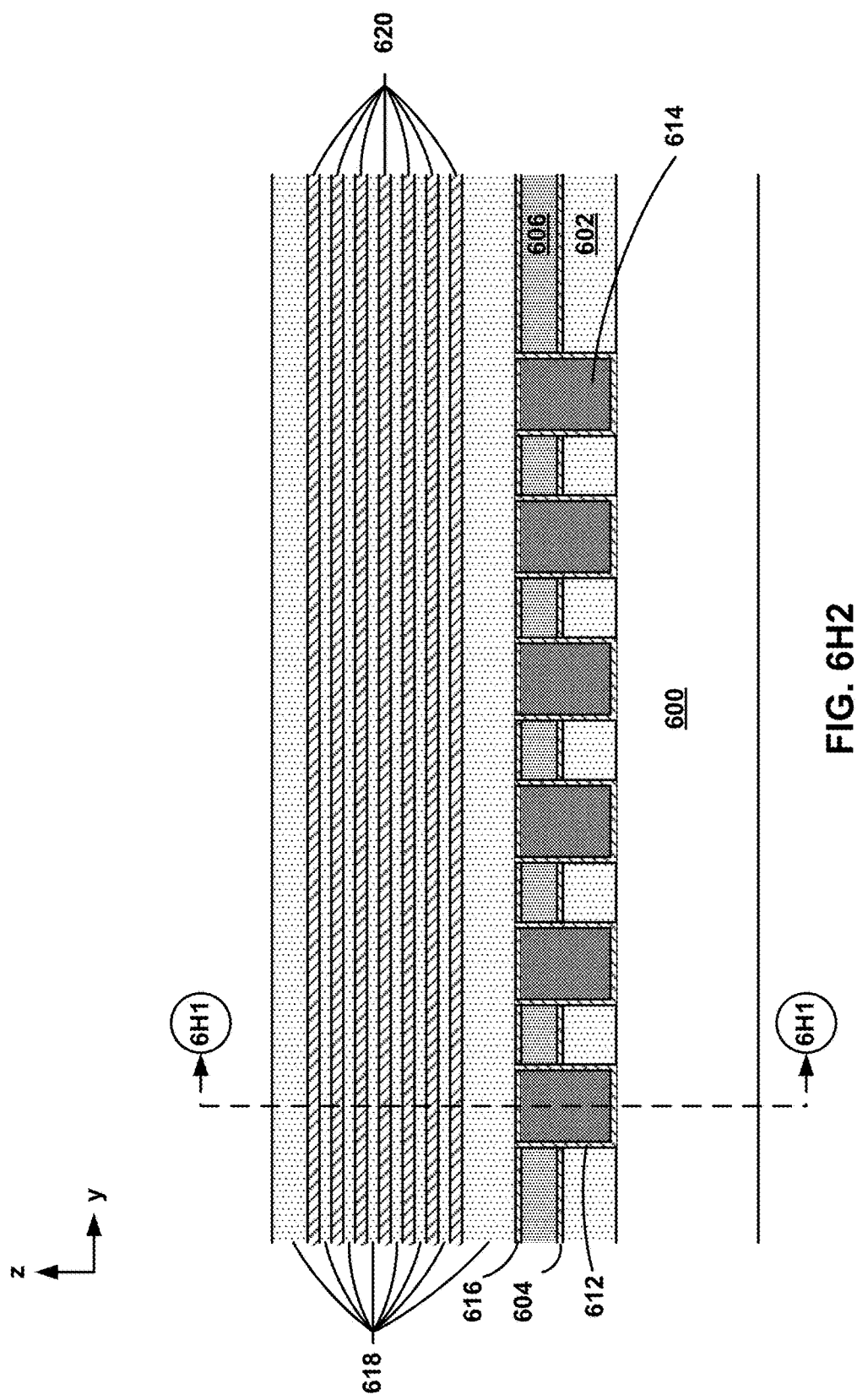

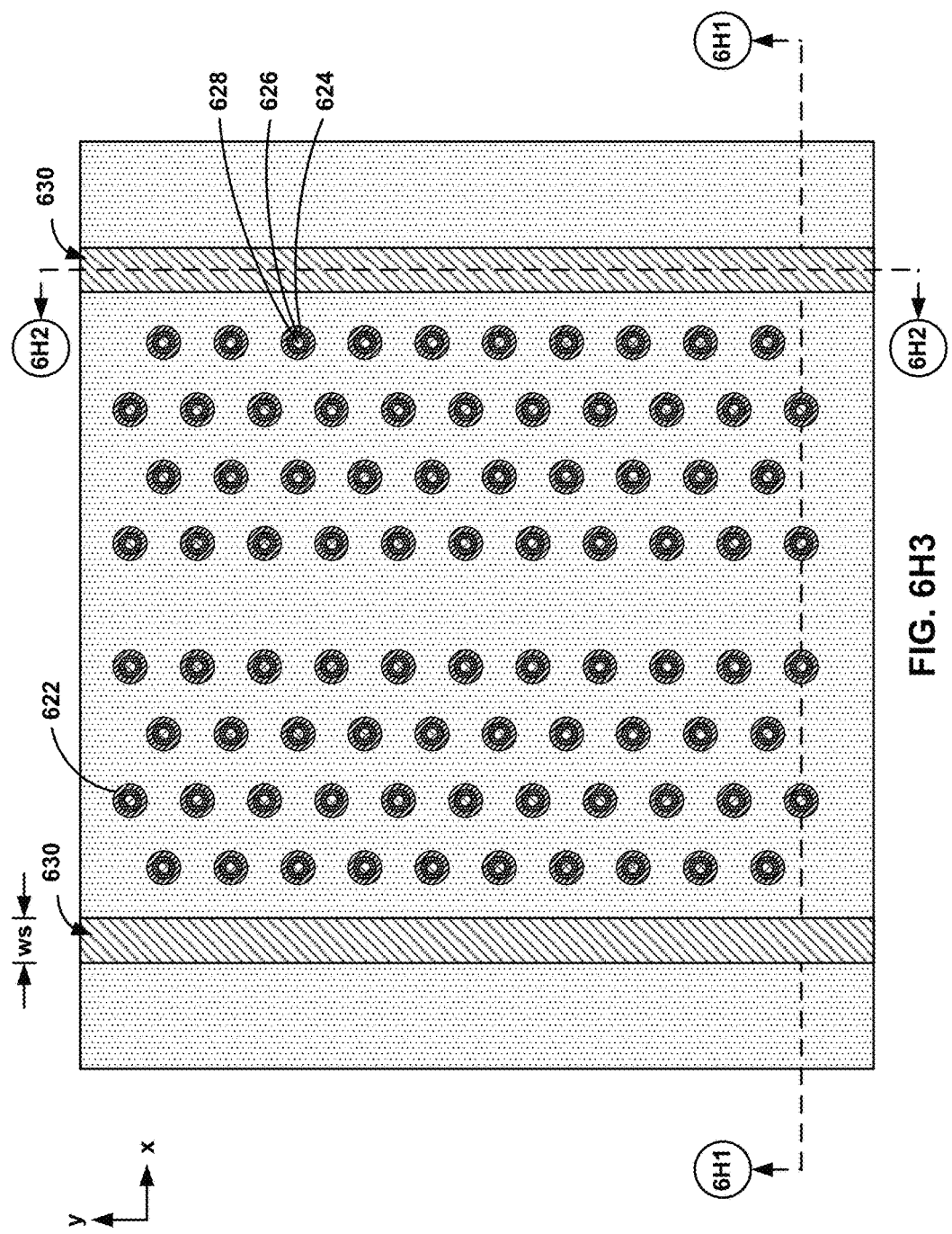
FIG. 6H3

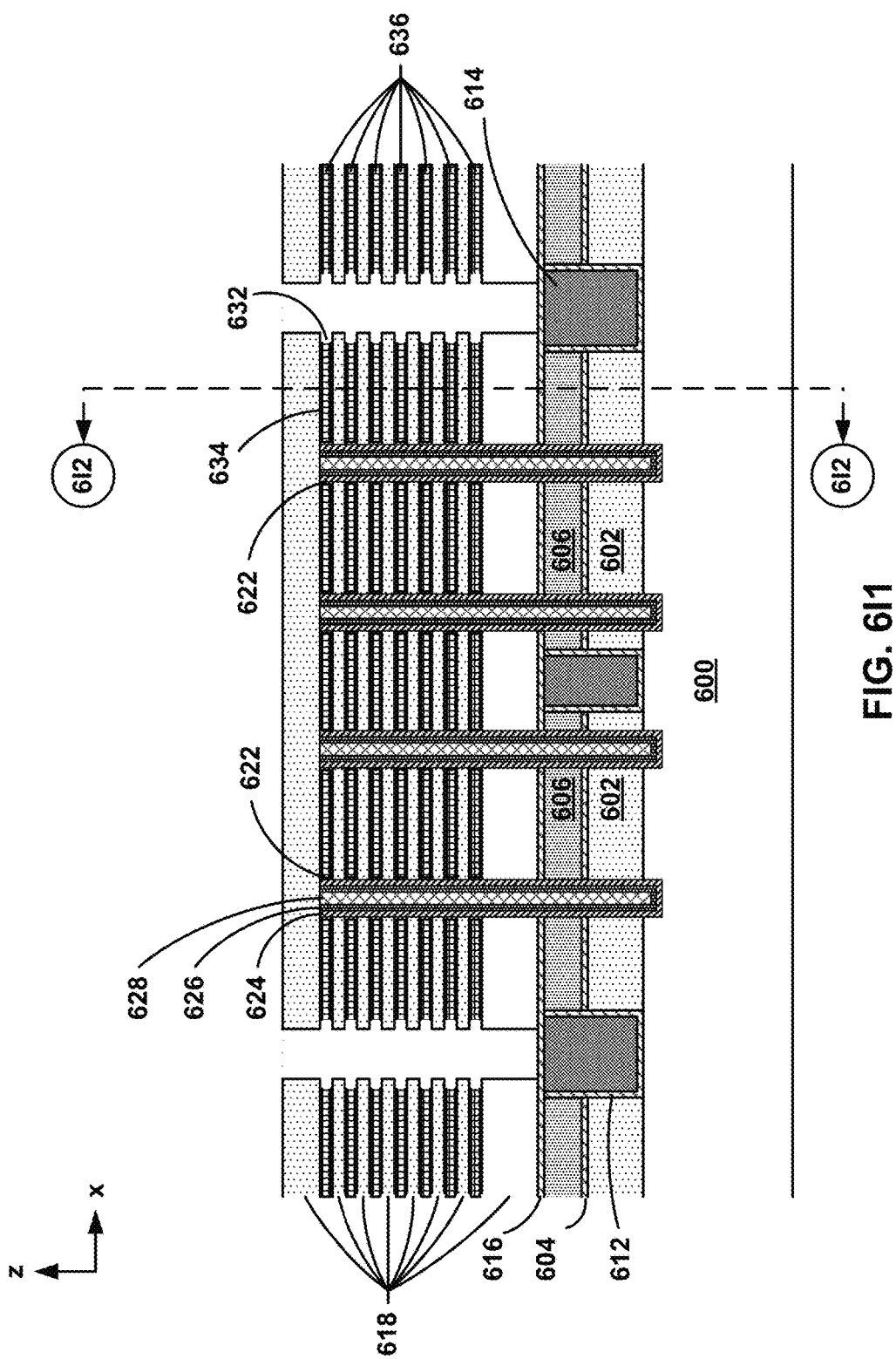

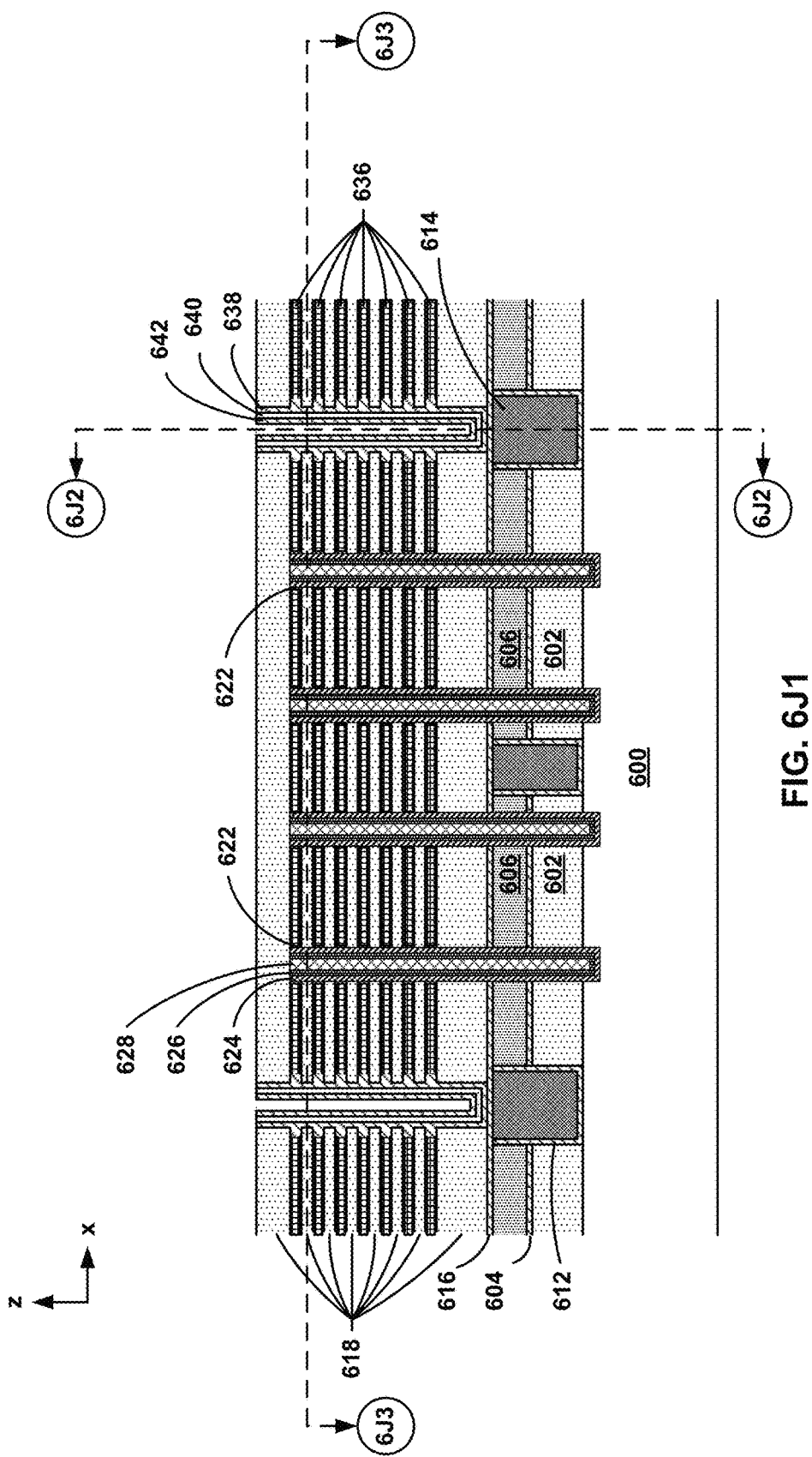
FIG. 6J1

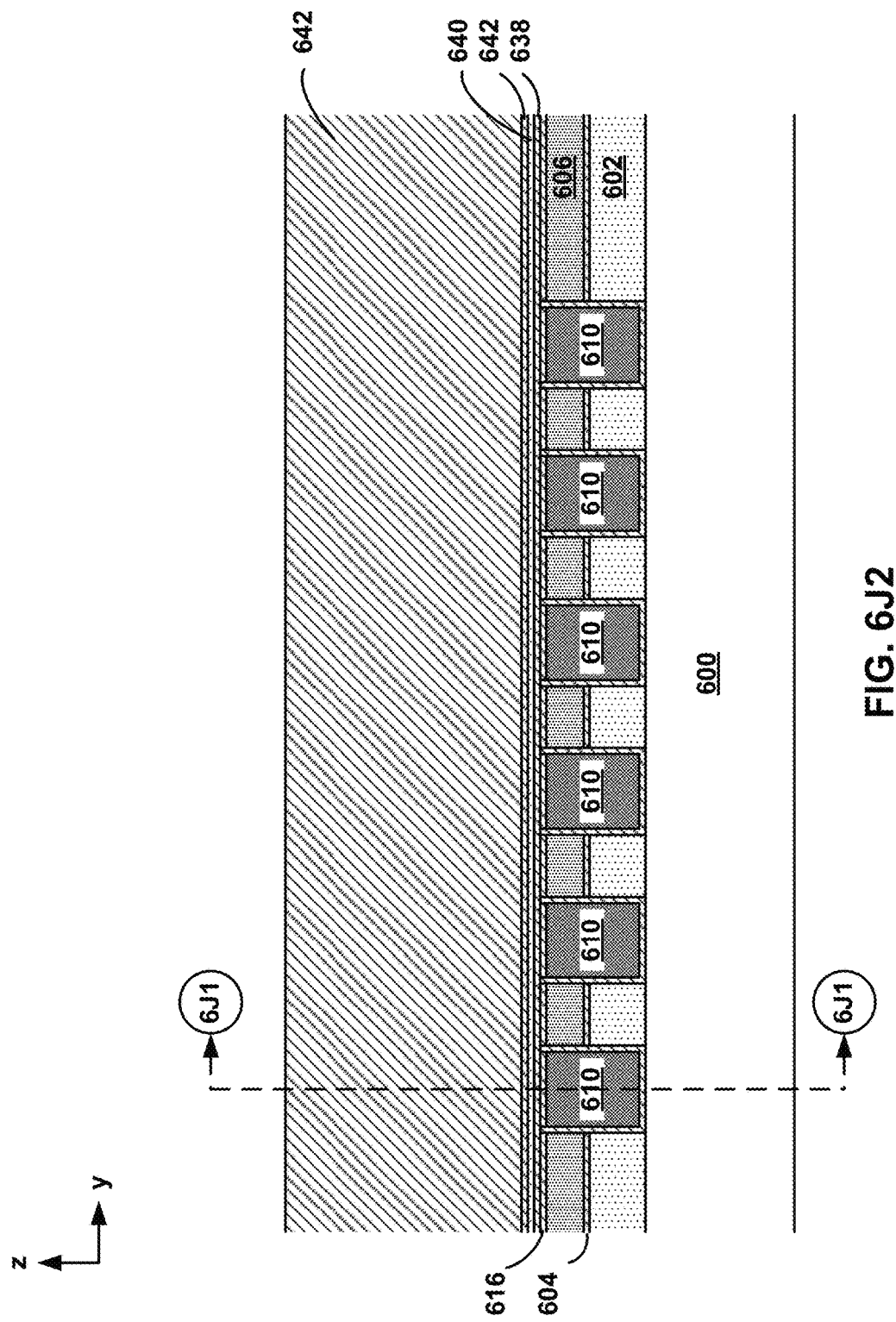

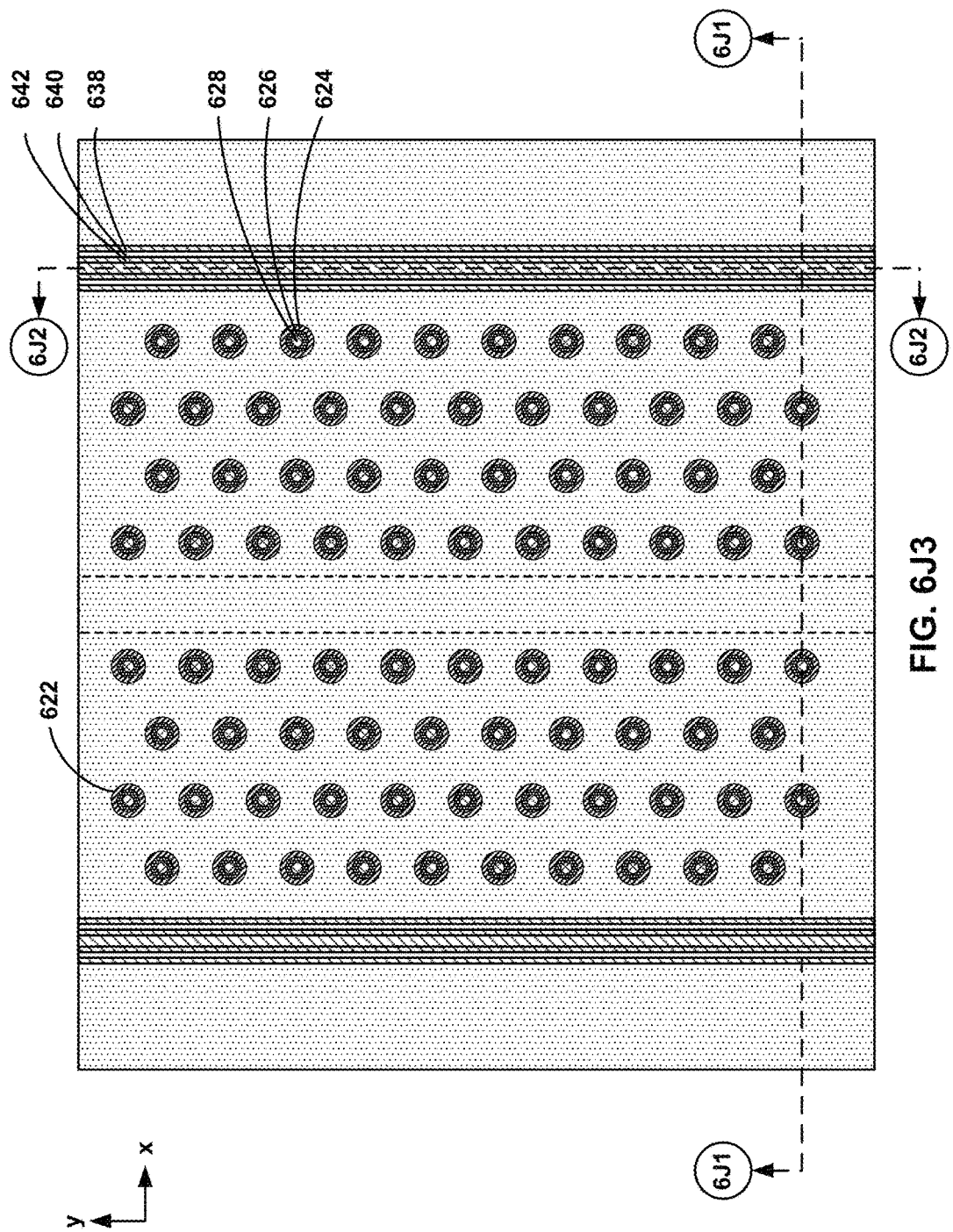
FIG. 6J3

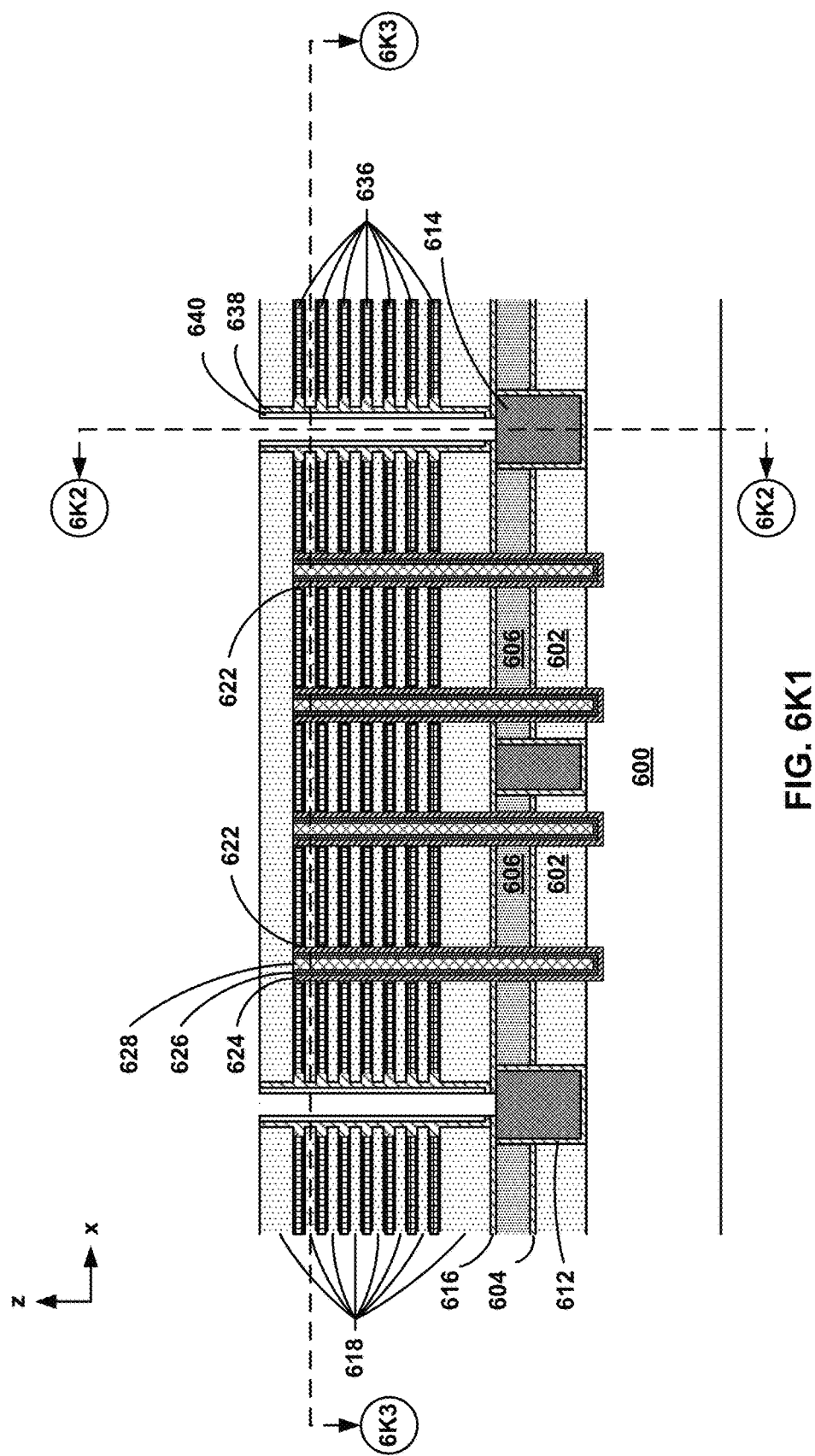
FIG. 6K1

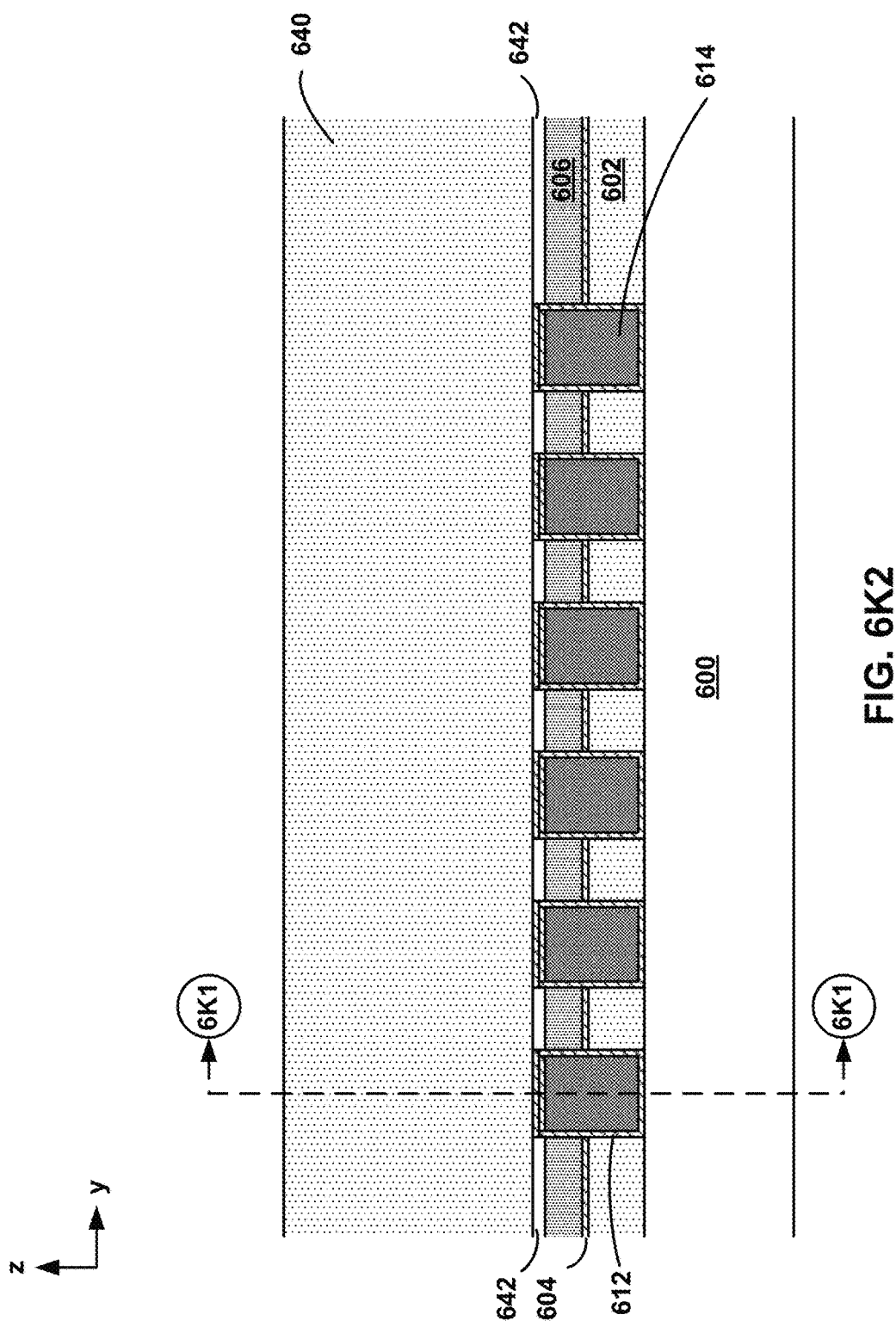
FIG. 6K2

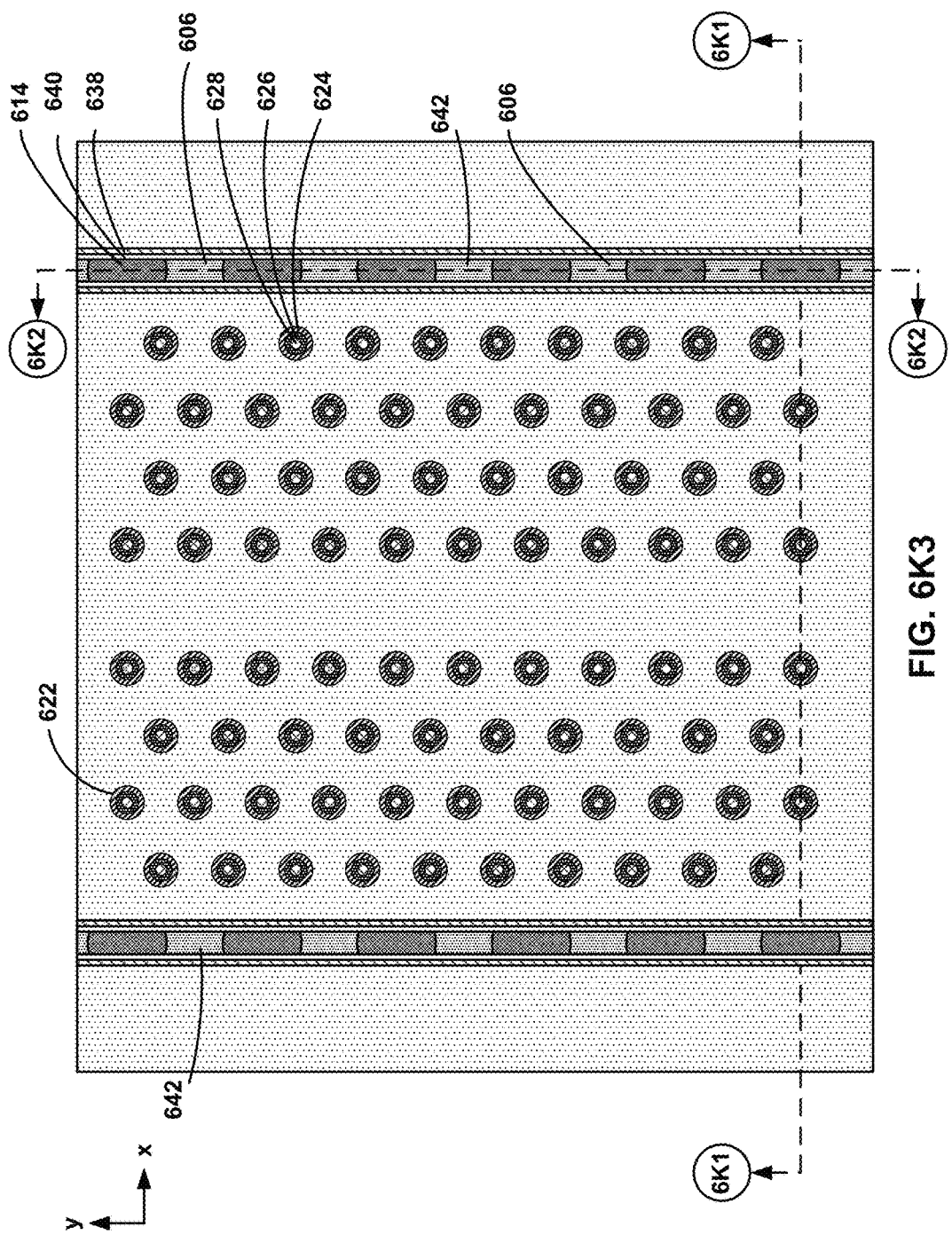
FIG. 6K3

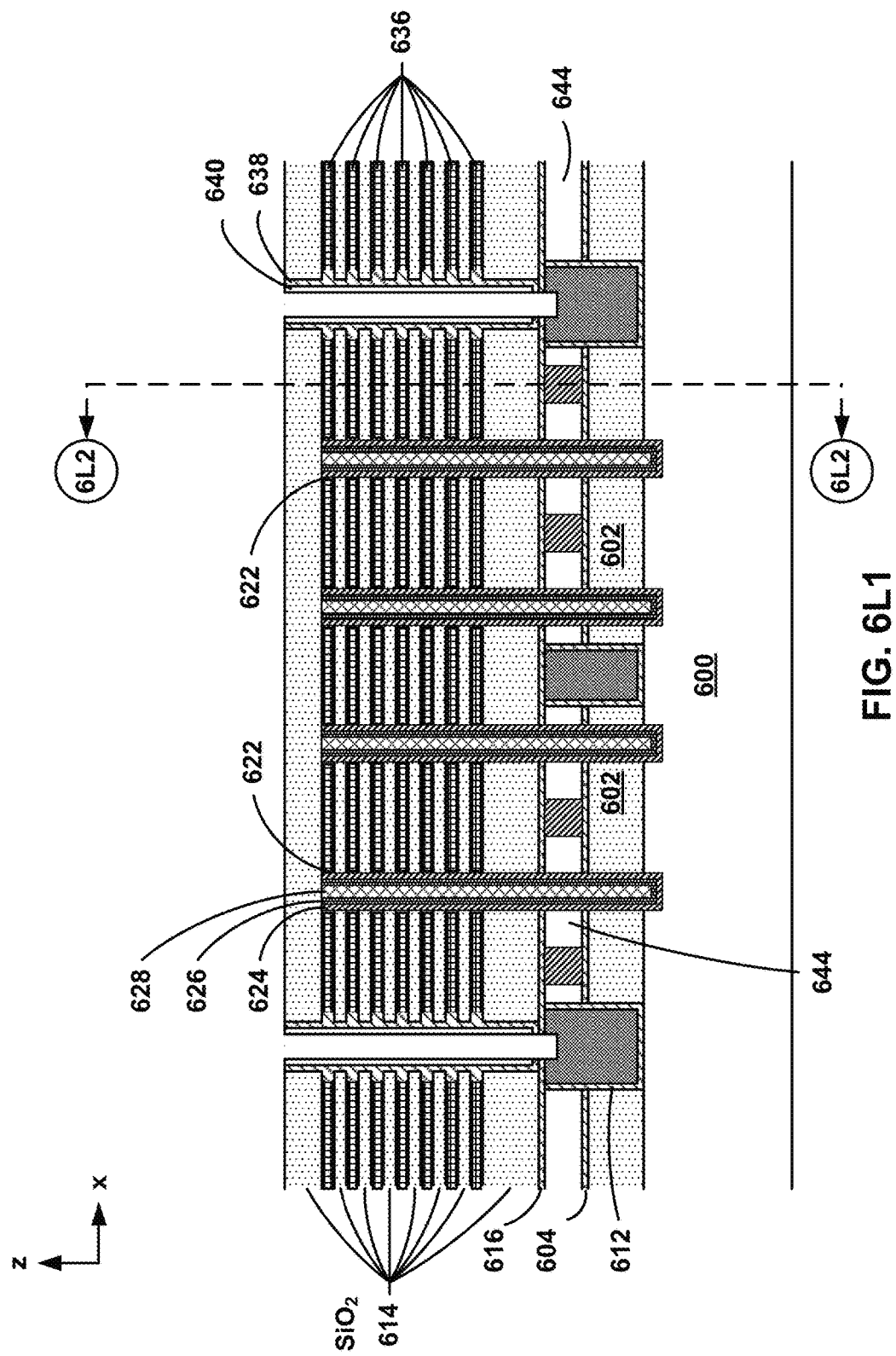
FIG. 6L1

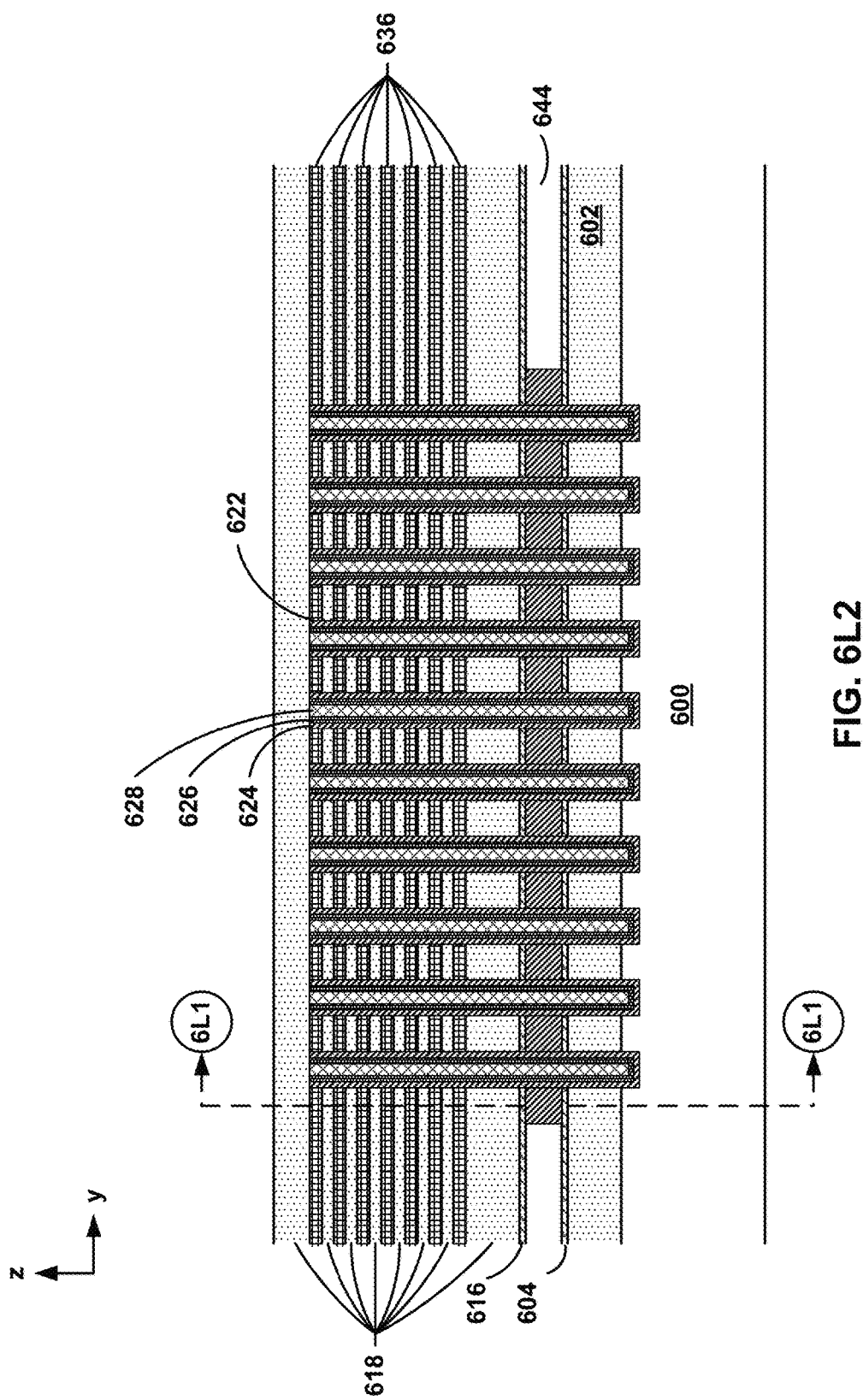
FIG. 6L2

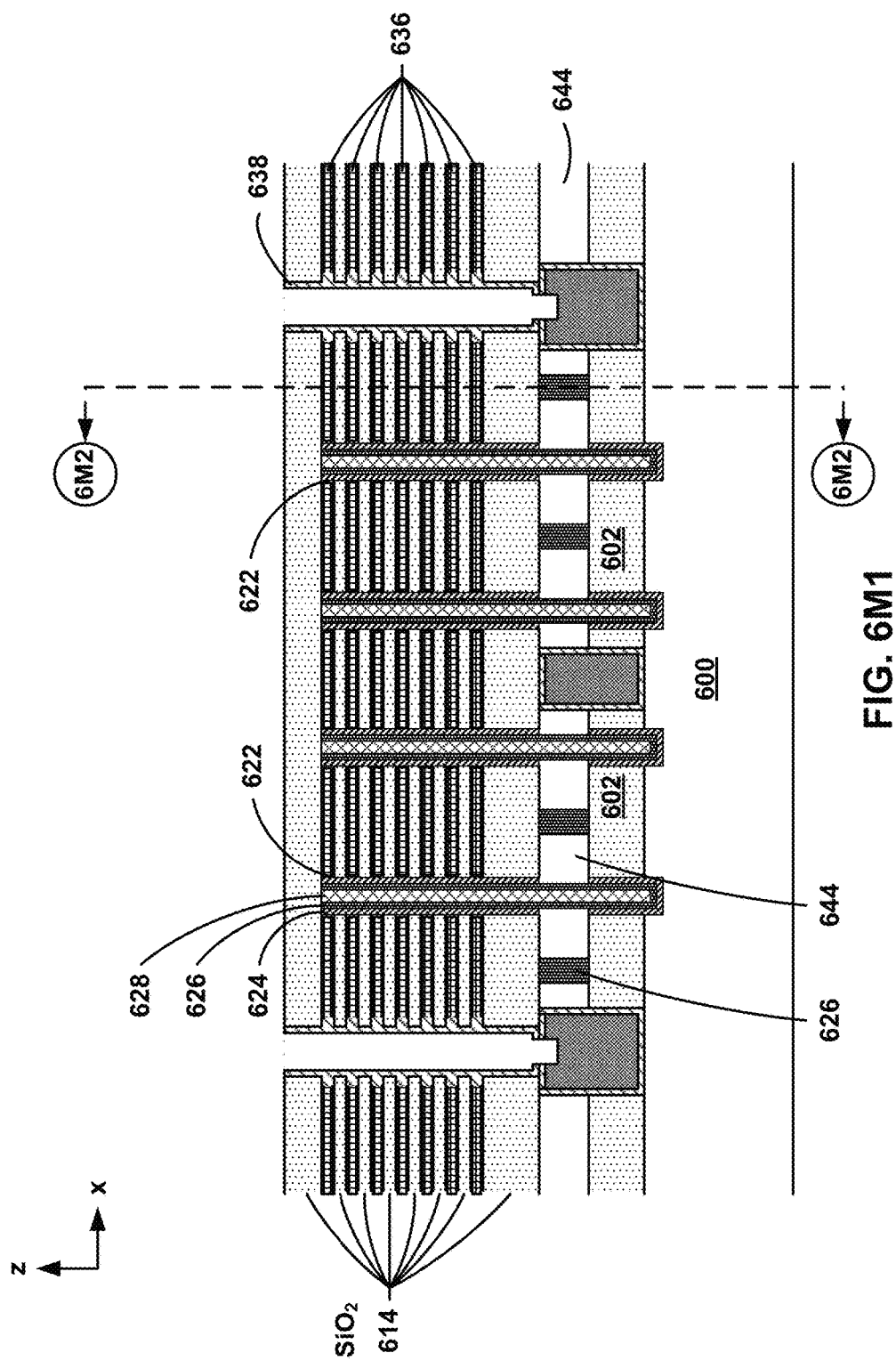
FIG. 6M1

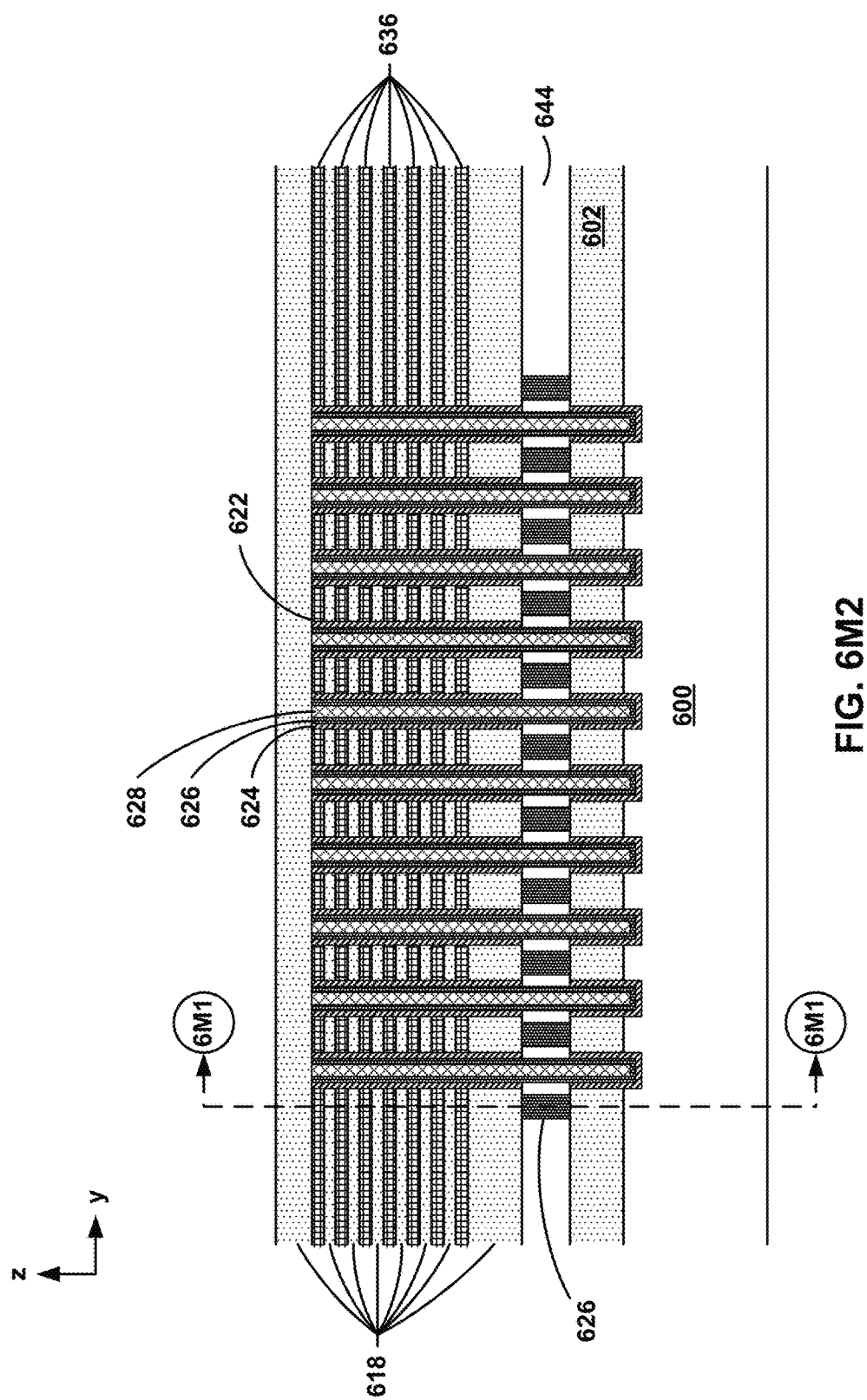
FIG. 6M2

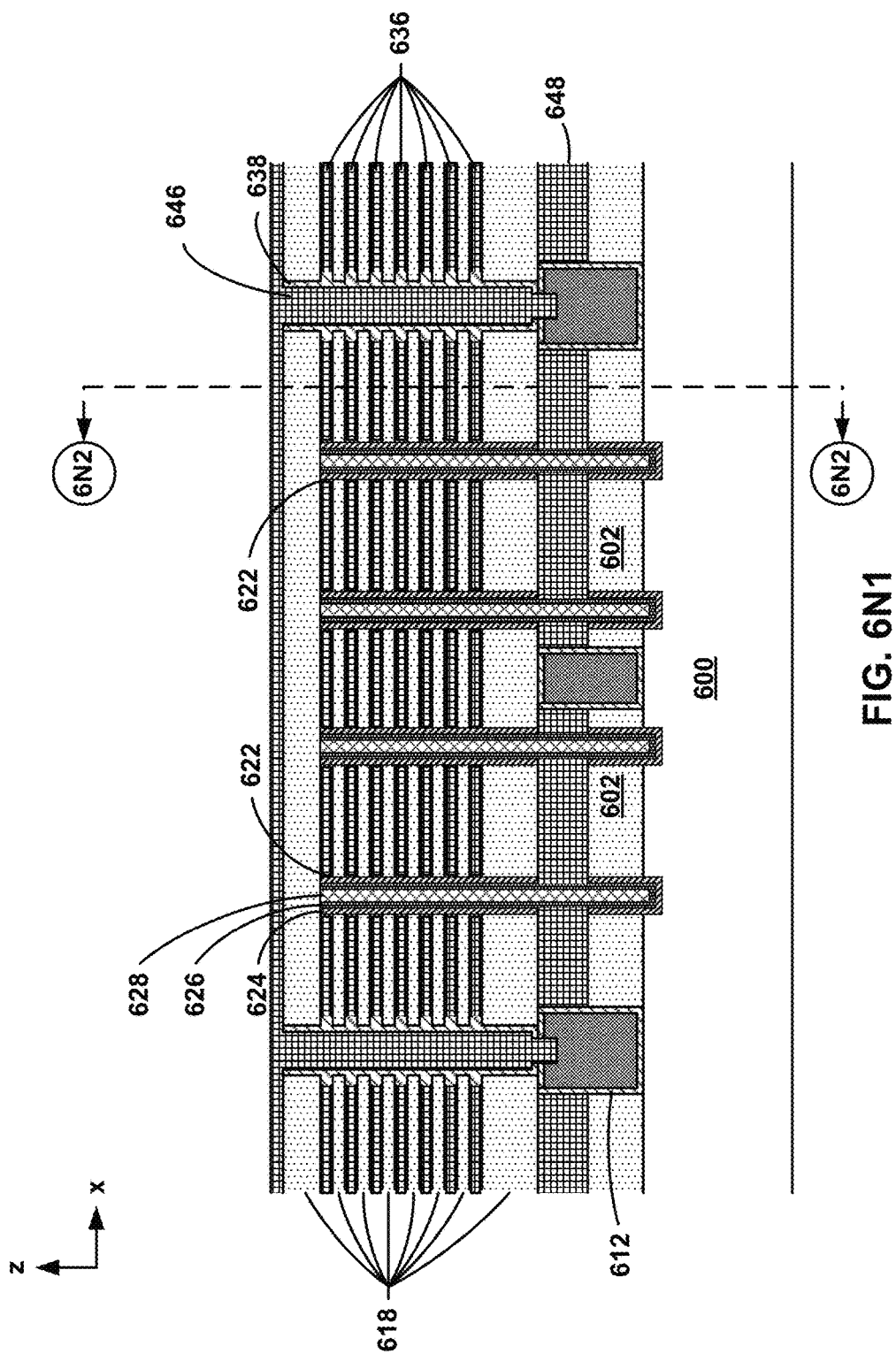
FIG. 6N1

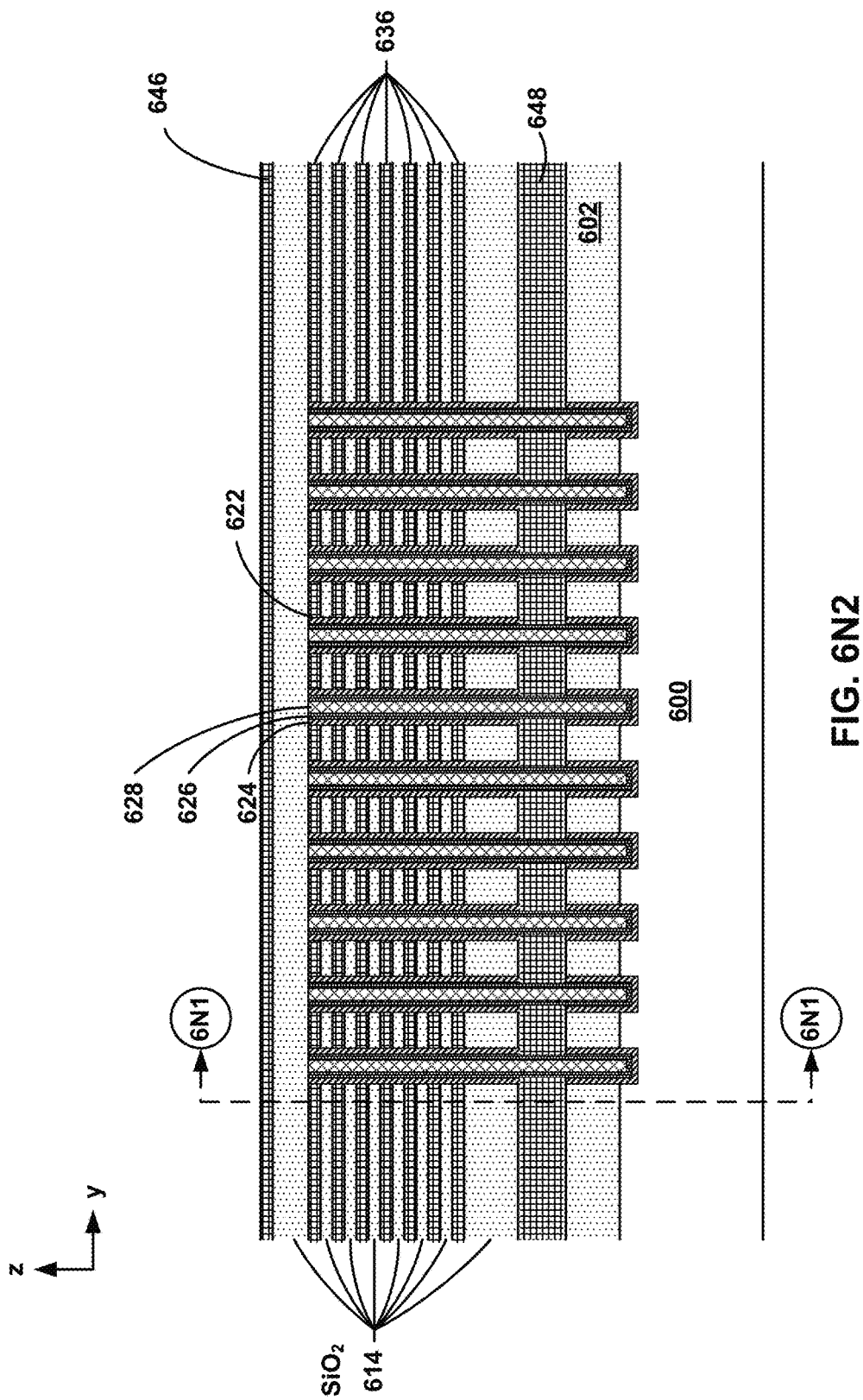
FIG. 6N2

METHODS AND APPARATUS FOR THREE-DIMENSIONAL NAND NON-VOLATILE MEMORY DEVICES WITH SIDE SOURCE LINE AND MECHANICAL SUPPORT

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. A straight NAND string extends in one memory hole. Control gates of the memory cells are provided by the conductive layers.

Some non-volatile memory devices are used to store two ranges of charges and, therefore, the memory cell can be programmed/erased between two ranges of threshold voltages that correspond to two data states: an erased state (e.g., data "1") and a programmed state (e.g., data "0"). Such a device is referred to as a binary or two-state device.

A multi-state (or multi-level) non-volatile memory is implemented by identifying multiple, distinct allowed ranges of threshold voltages. Each distinct rang of threshold voltages corresponds to a data state assigned a predetermined value for the set of data bits. The specific relationship between the data programmed into the memory cell and the ranges of threshold voltages depends upon the data encoding scheme adopted for the memory cells. For example, U.S. Pat. No. 6,222,762 and U.S. Patent Publication No. 2004/0255090 both describe various data encoding schemes for multi-state flash memory cells. Although multi-state non-volatile memory can store more data than binary non-volatile memory, the process for programming and verifying the programming can take longer for multi-state non-volatile memory.

BRIEF DESCRIPTION OF THE DRAWINGS

Like-numbered elements refer to common components in the different figures.

FIGS. 6A1-6N2 are cross-sectional views of a portion of a substrate during an example fabrication of the memory structure of FIG. 5.

DETAILED DESCRIPTION

A method of fabricating a monolithic three dimensional memory structure is provided. The method includes forming a stack of alternating word line and dielectric layers above a substrate, forming a source line above the substrate, forming a memory hole extending through the alternating word line and dielectric layers and the source line, and forming a mechanical support element on the substrate adjacent to the memory hole.

The following discussion provides details of one example of a suitable structure for a memory device that can implement the proposed technology.

Figure 1:
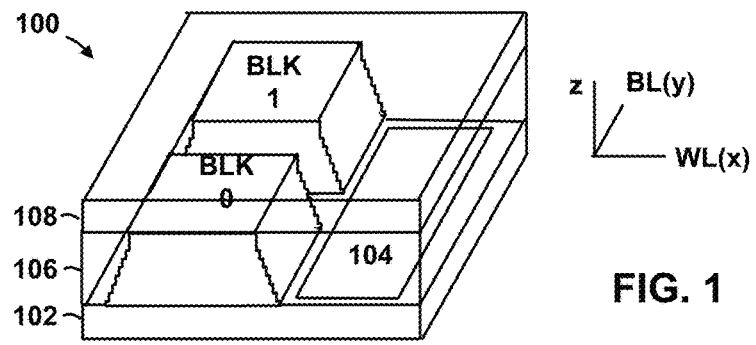
FIG. 1 is a perspective view of a 3D stacked non-volatile memory device.

FIG. 1 is a perspective view of a three dimensional (3D) stacked non-volatile memory device 100, which includes a substrate 102. On and above substrate 102 are example blocks BLK0 and BLK1 of memory cells (non-volatile storage elements). Also on substrate 102 is peripheral area 104 with support circuits for use by blocks BLK0 and BLK1. Substrate 102 also can carry circuits under the blocks, along with one or more lower metal layers which are patterned in conductive paths to carry signals of the circuits.

Blocks BLK0 and BLK1 are formed in an intermediate region 106 of memory device 100. In an upper region 108 of memory device 100, one or more upper metal layers are patterned in conductive paths to carry signals of the circuits. Each of blocks BLK0 and BLK1 includes a stacked area of memory cells, where alternating levels of the stack represent word lines. Although two blocks BLK0 and BLK1 are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
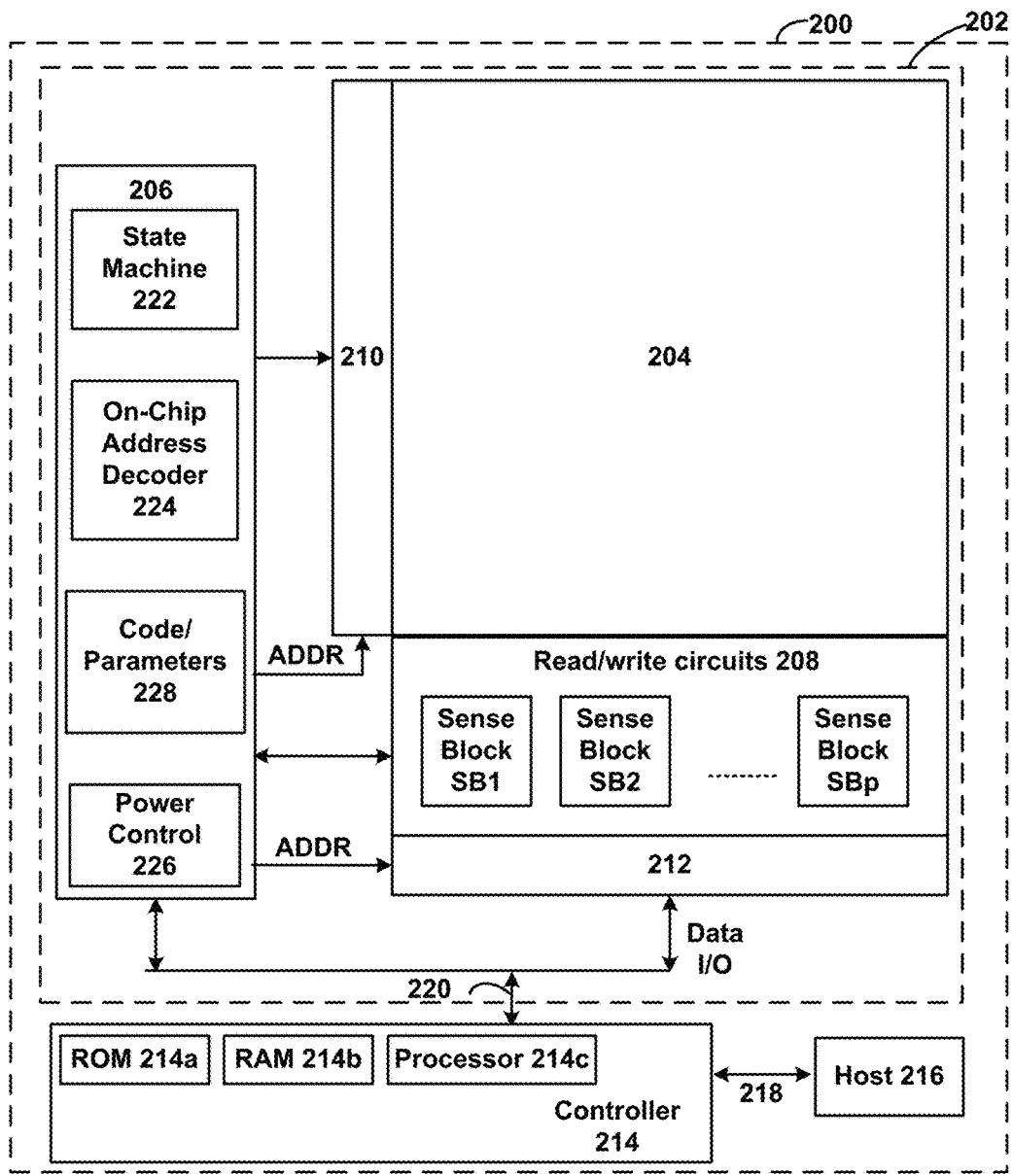
FIG. 2 is a functional block diagram of a memory device 200, which is an example of the 3D stacked non-volatile memory device 100 of FIG. 1.

FIG. 2 is a functional block diagram of an example memory device 200, which is an example of the 3D stacked non-volatile memory device 100 of FIG. 1. The components depicted in FIG. 2 are electrical circuits. Memory device 200 includes one or more memory die 202. Each memory die 202 includes a three dimensional memory structure 204 of memory cells (such as, for example, a 3D array of memory cells), control circuitry 206, and read/write circuits 208. In other embodiments, a two dimensional array of memory cells can be used.

Memory structure 204 is addressable by word lines via a row decoder 210 and by bit lines via a column decoder 212. Read/write circuits 208 include multiple sense blocks SB1, SB2, . . . , SBp (sensing circuitry) and allow a page of memory cells to be read or programmed in parallel. In some systems, a controller 214 is included in the same memory device 200 (e.g., a removable storage card) as the one or more memory die 202. However, in other systems, controller 214 can be separated from memory die 202.

In some embodiments, one controller 214 will communicate with multiple memory die 202. In other embodiments, each memory die 202 has its own controller. Commands and data are transferred between a host 216 and controller 214 via a data bus 218, and between controller 214 and the one or more memory die 202 via lines 220. In one embodiment, memory die 202 includes a set of input and/or output (I/O) pins that connect to lines 220.

Memory structure 204 may include one or more arrays of memory cells including a 3D array. Memory structure 204 may include a monolithic three dimensional memory structure in which multiple memory levels are formed above (and not in) a single substrate, such as a wafer, with no intervening substrates. Memory structure 204 may include any type of non-volatile memory that is monolithically formed in one or more physical levels of arrays of memory cells having an active area disposed above a silicon substrate. Memory structure 204 may be in a non-volatile memory device having circuitry associated with the operation of the memory cells, whether the associated circuitry is above or within the substrate.

Control circuitry 206 cooperates with read/write circuits 208 to perform memory operations (e.g., erase, program, read, and others) on memory structure 204, and includes a state machine 222, an on-chip address decoder 224, and a power control module 226. State machine 222 provides chip-level control of memory operations. Code and parameter storage 228 may be provided for storing operational parameters and software. In one embodiment, state machine 222 is programmable by the software stored in code and parameter storage 228. In other embodiments, state machine 222 does not use software and is completely implemented in hardware (e.g., electronic circuits).

On-chip address decoder 224 provides an address interface between addresses used by host 216 or memory controller 214 to the hardware address used by decoders 210 and 212. Power control module 226 controls the power and voltages supplied to the word lines and bit lines during memory operations. Power control module 226 can include drivers for word line layers (discussed below) in a 3D configuration, select transistors (e.g., SGS and SGD transistors, described below) and source lines. Power control module 226 may include charge pumps for creating voltages. Sense blocks SB1, SB2, . . . , SBp include bit line drivers. An SGS transistor is a select gate transistor at a source end of a NAND string, and an SGD transistor is a select gate transistor at a drain end of a NAND string.

Any one or any combination of control circuitry 206, state machine 222, decoders 224/210/212, code and parameter storage 228, power control module 226, sense blocks SB1, SB2, . . . , SBp, read/write circuits 208, and controller 214 can be considered one or more control circuits that performs the functions described herein.

The (on-chip or off-chip) controller 214 may include storage devices (memory) such as ROM 214a and RAM 214b and a processor 214c. Storage devices ROM 214a and RAM 214b include code such as a set of instructions, and processor 214c is operable to execute the set of instructions to provide the functionality described herein. Alternatively or additionally, processor 214c can access code from a storage device in memory structure 204, such as a reserved area of memory cells connected to one or more word lines.

Multiple memory elements in memory structure 204 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level and other strings contain memory elements which span through multiple memory levels. Three dimensional memory arrays may also be designed in a NOR configuration and in a ReRAM configuration.

A person of ordinary skill in the art will recognize that this technology is not limited to a single specific memory structure, but covers many relevant memory structures within the spirit and scope of the technology as described herein and as understood by one of ordinary skill in the art.

Figure 3A:
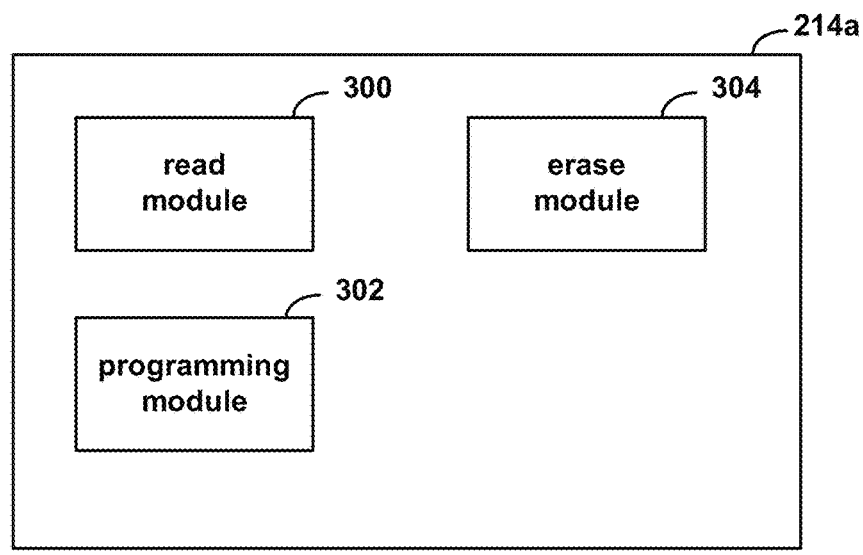
FIG. 3A is a block diagram depicting software modules for programming one or more processors in a controller.

FIG. 3A is a block diagram depicting software modules for programming one or more processors in controller 214 of FIG. 2. FIG. 3A depicts read module 300, programming module 302, and erase module 304 being stored in ROM 214a. These software modules also can be stored in RAM or memory die 202. Read module 300 includes software that programs processor(s) 214c to perform read operations.

Programming module 302 includes software that programs processor(s) 214c to perform programming operations (including verification of programming). Erase module 304 includes software that programs processor(s) 214c to perform erase operations. Based on the software, controller 214 instructs memory die 202 to perform memory operations.

Figure 3B:
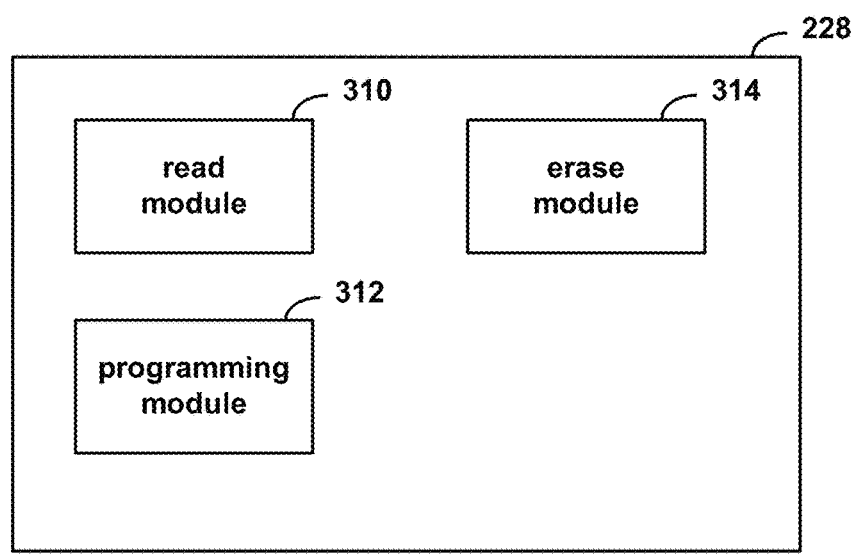
FIG. 3B is a block diagram depicting software modules for programming a state machine or other processor on a memory die.

FIG. 3B is a block diagram depicting software modules for programming state machine 222 of FIG. 2 (or other processor on memory die 202). FIG. 3B depicts read module 310, programming module 312, and erase module 314 being stored in code and parameter storage 228. These software modules can also be stored in RAM or in memory structure 204 of FIG. 2. Read module 310 includes software that programs state machine 222 to perform read operations. Programming module 302 includes software that programs state machine 222 to perform programming operations (including verification of programming). Erase module 304 includes software that programs state machine 222 to perform erase operations. Alternatively, state machine 222 (which is an electronic circuit) can be completely implemented with hardware so that no software is needed to perform these functions.

Figure 4A:
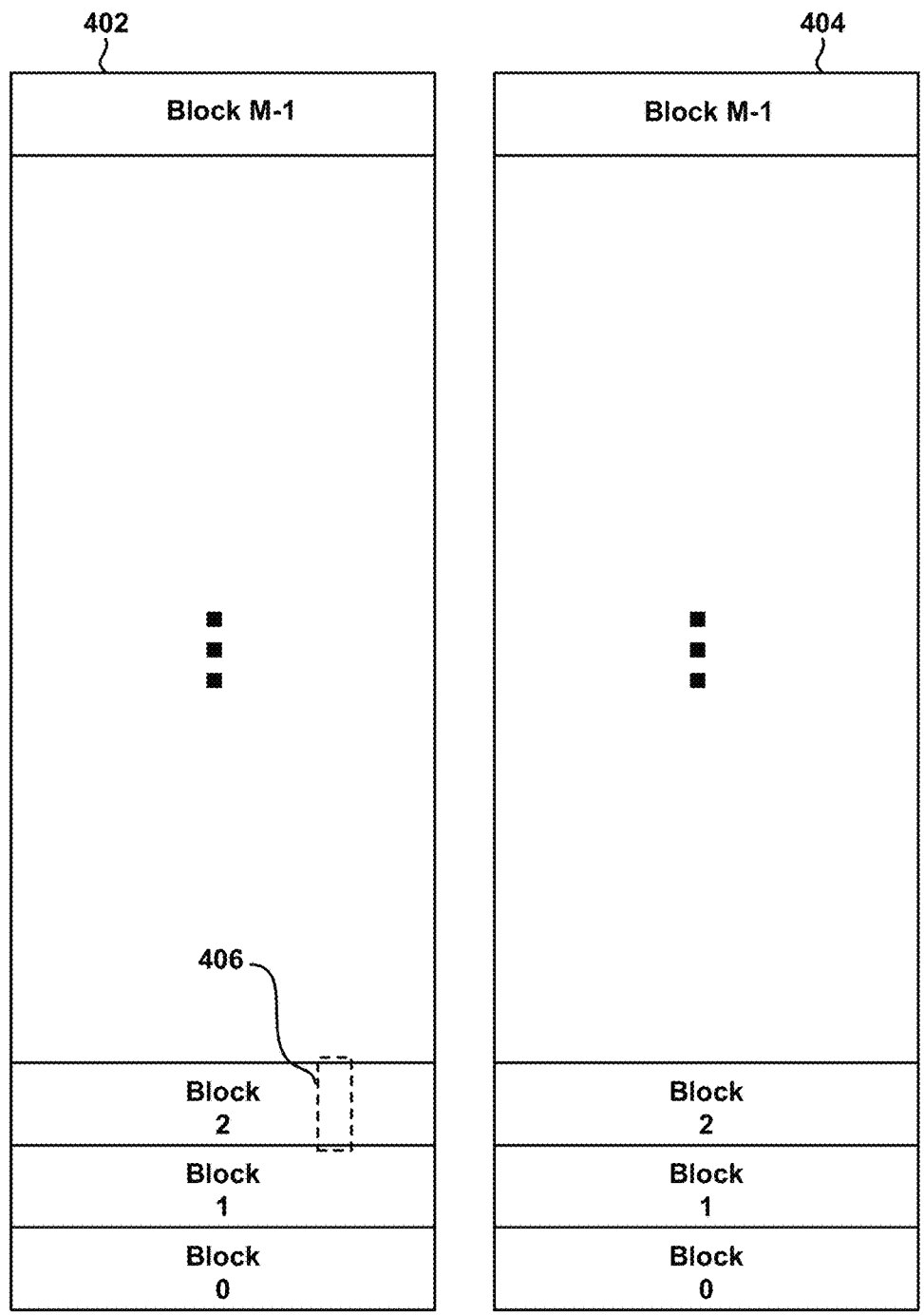
FIG. 4A is a block diagram of a memory structure having two planes.

FIG. 4A is a block diagram explaining one example organization of memory structure 204, which is divided into two planes 402 and 404. Each plane is then divided into M blocks. In one example, each plane has about 2000 blocks. However, different numbers of blocks and planes can also be used.

Figure 4B:
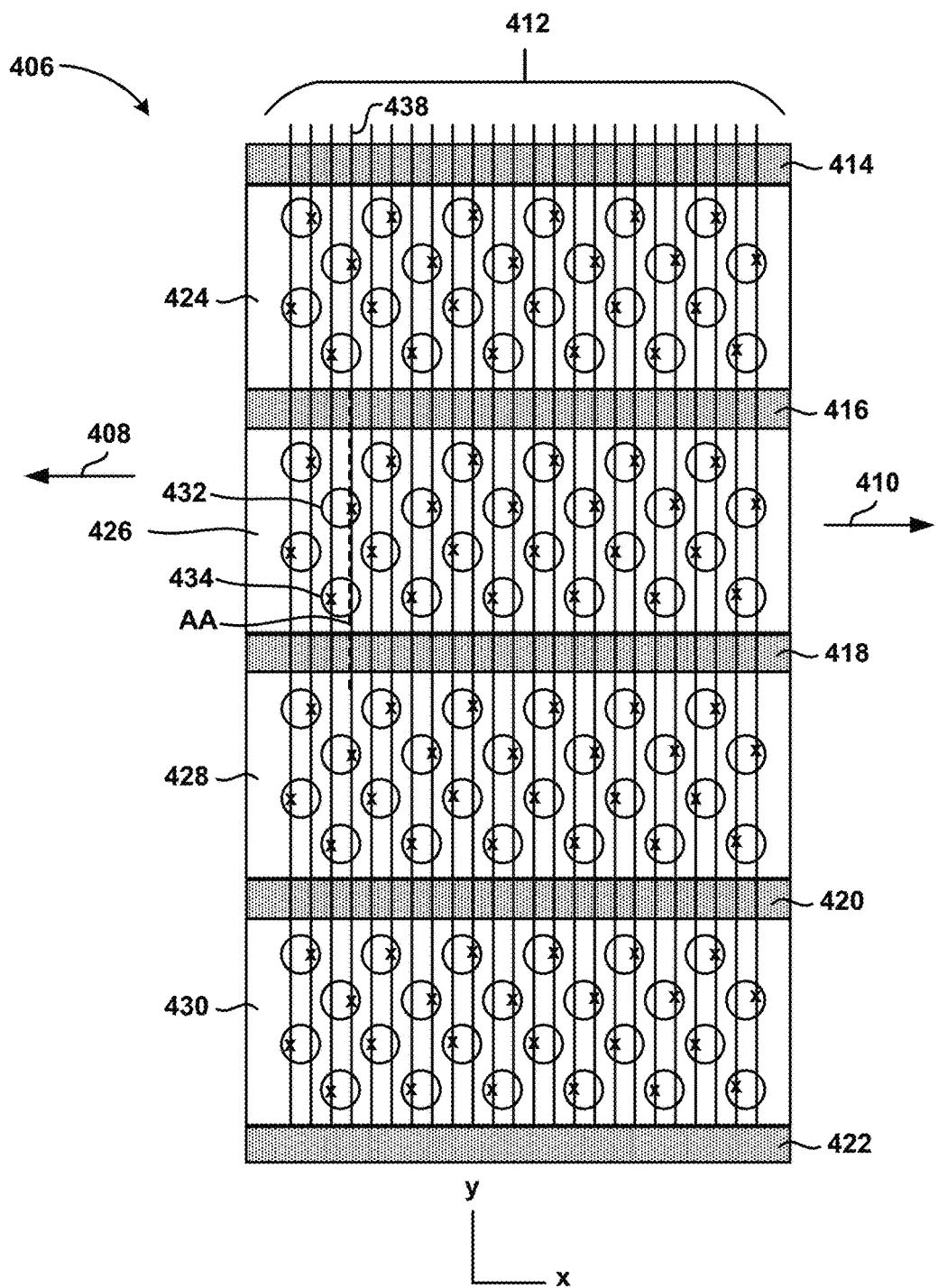
FIG. 4B is a top view of a portion of a block of memory cells.

FIGS. 4B-4E depict an example 3D NAND structure. FIG. 4B is a block diagram depicting a top view of a portion of one block from memory structure 204. The portion of the block depicted in FIG. 4B corresponds to portion 406 in block 2 of FIG. 4A. The block depicted in FIG. 4B extends in the direction of arrow 408 and in the direction of arrow 410. In one embodiment, the memory array will have 48 layers. Other embodiments have less than or more than 48 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Because the block depicted in FIG. 4B extends in the direction of arrow 408 and in the direction of arrow 410, the block includes more vertical columns than depicted in FIG. 4B FIG. 4B also depicts a set of bit lines 412. FIG. 4B shows twenty four bit lines because only a portion of the block is depicted. In other embodiments, more than twenty four bit lines are connected to vertical columns of the block. Each of the circles representing vertical columns has an "x" to indicate its connection to one bit line.

The block depicted in FIG. 4B includes a set of local interconnects 414, 416, 418, 420 and 422 that connect the various layers to a source line below the vertical columns. Local interconnects 414, 416, 418, 420 and 422 also serve to divide each layer of the block into four regions. For example, the top layer depicted in FIG. 4B is divided into regions 424, 426, 428 and 430.

In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together.

In one example implementation, a bit line only connects to one vertical column in each of regions 424, 426, 428 and 430. In that implementation, each block has sixteen rows of active columns and each bit line connects to four rows in each block. In one embodiment, all of four rows connected to a common bit line are connected to the same word line (via different word line fingers on the same level that are connected together). Therefore, the system uses the source select lines and the drain select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
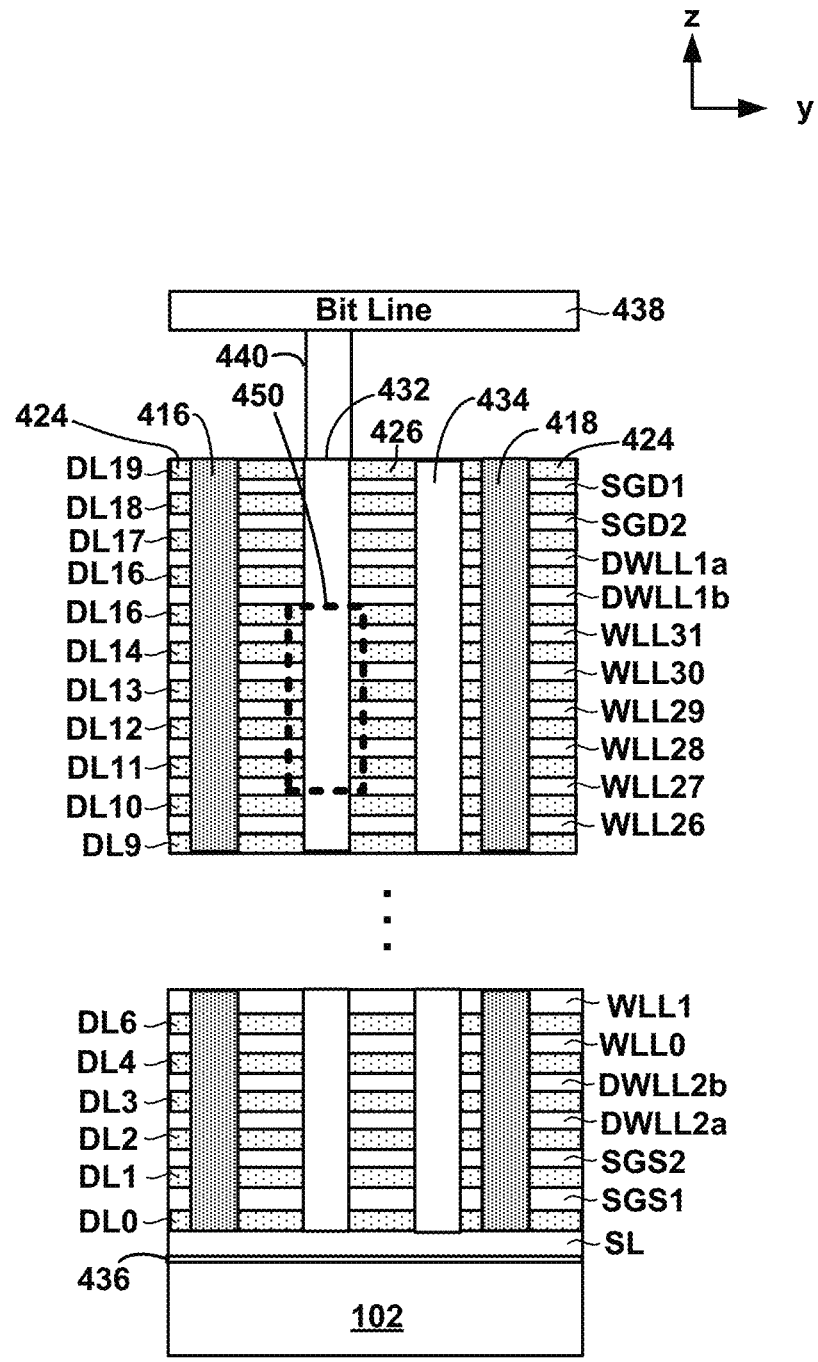
FIG. 4C is a cross-sectional view of a portion of a block of memory cells.

FIG. 4C depicts a portion of an embodiment of three dimensional memory structure 204 showing a cross-sectional view along line AA of FIG. 4B. This cross-sectional view cuts through vertical columns 432 and 434 and region 426 (see FIG. 4B). The structure of FIG. 4C includes two drain select layers (SGD1 and SGD1), two source select layers (SGS1 and SGS2), four dummy word line layers (DWLL1a, DWLL1b, DWLL2a and DWLL2b), and thirty two word line layers (WLL0-WLL31) for connecting to data memory cells. Other embodiments can implement more or less than two drain select layers, more or less than two source select layers, more or less than four dummy word line layers, and more or less than thirty two word line layers.

Vertical columns 432 and 434 are depicted protruding through the drain select layers, source select layers, dummy word line layers and word line layers. In one embodiment, each of vertical columns 432 and 434 comprises a NAND string. Vertical columns 432 and 434 and the layers listed below are disposed above substrate 102, an insulating film 436 on substrate 102, and a source line SL on insulating film 436. Vertical column 432 is connected to Bit Line 438 via connector 440. Local interconnects 416 and 418 are also depicted.

For ease of reference, drain select layers (SGD1 and SGD1), source select layers (SGS1 and SGS2), dummy word line layers (DWLL1a, DWLL1b, DWLL2a and DWLL2b), and word line layers (WLL0-WLL31) collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials.

Between conductive layers are dielectric layers DL0-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, whereas a data memory cell is eligible to store user data. Thus, data memory cells may be programmed. Drain select layers SGD1 and SGD1 are used to electrically connect and disconnect NAND strings from bit lines. Source select layers SGS1 and SGS2 are used to electrically connect and disconnect NAND strings from the source line SL.

Figure 4D:
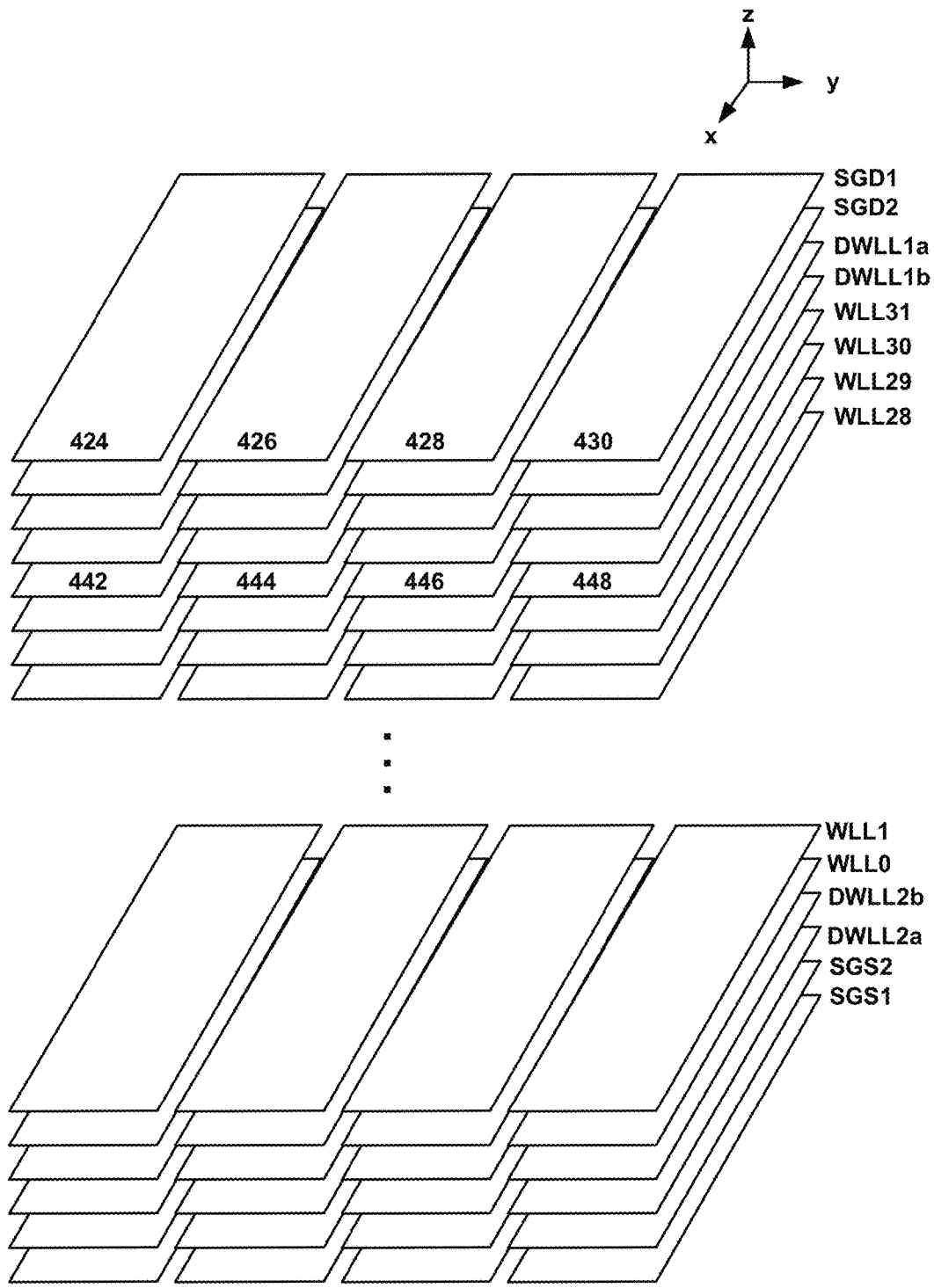
FIG. 4D is a view of the select gate layers and word line layers.

FIG. 4D depicts a perspective view of the conductive layers (SGD1, SGD1, SGS1, SGS2, DWLL1a, DWLL1b, DWLL2a, DWLL2b, and WLL0-WLL31) for the block that is partially depicted in FIG. 4C. As mentioned above with respect to FIG. 4B, local interconnects 414, 416, 418, 420 and 422 break up each conductive layers into four regions. For example, drain select gate layer SGD1 (the top layer) is divided into regions 424, 426, 428 and 430. Similarly, word line layer WLL31 is divided into regions 442, 444, 446 and 448. For word line layers (WLL0-WLL31), the regions are referred to as word line fingers; for example, word line layer WLL31 is divided into word line fingers 442, 444, 446 and 448.

Figure 4E:
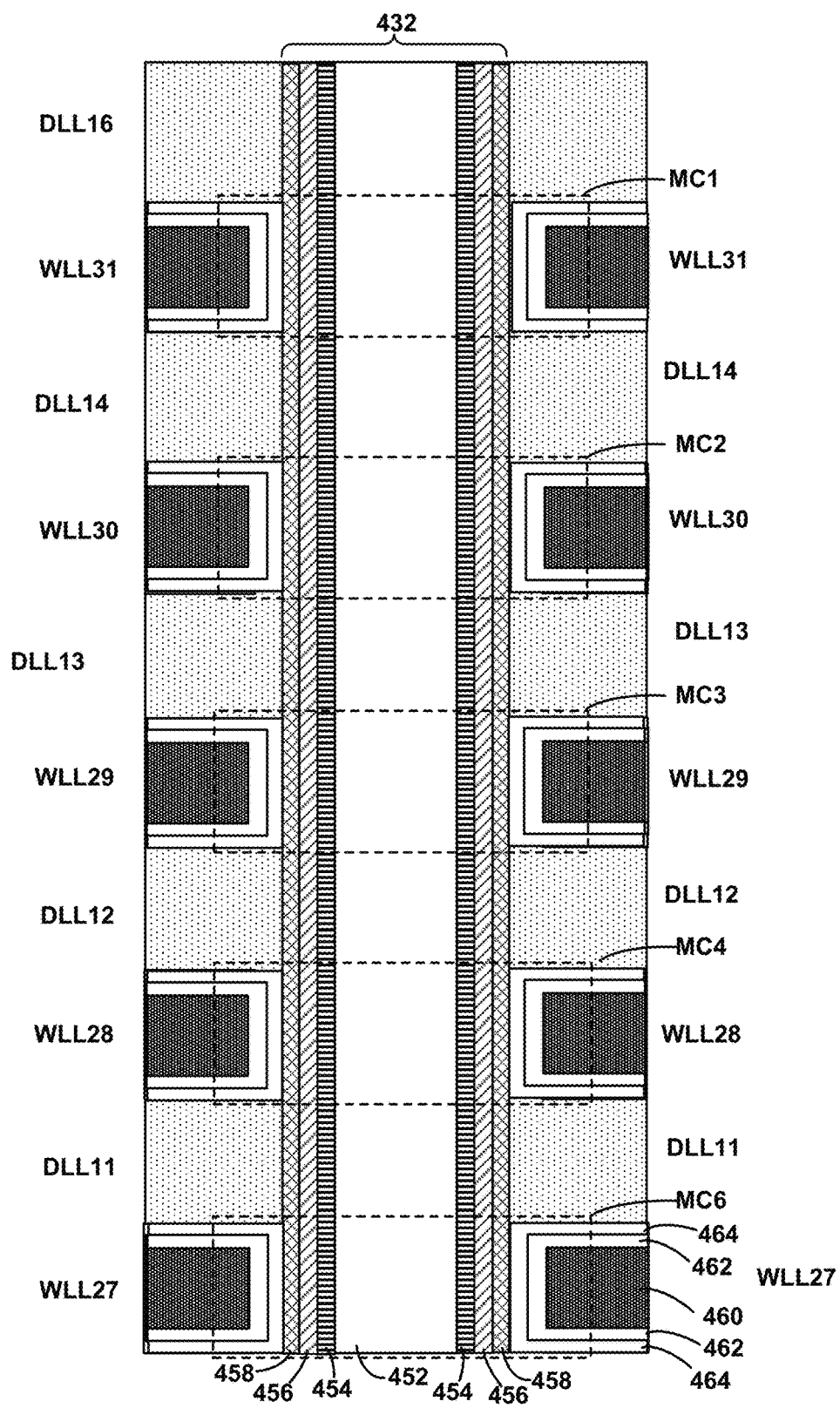
FIG. 4E is a cross-sectional view of a vertical column of memory cells.

FIG. 4E depicts a cross sectional view of region 450 of FIG. 4C that includes a portion of vertical column 432. In one embodiment, the vertical columns are round and include four layers. In other embodiments, however, more or less than four layers can be included and other shapes can be used. In one embodiment, vertical column 432 includes an inner core layer 452 that is made of a dielectric, such as $SiO_2$. Other materials can also be used. Surrounding inner core 452 is vertical polysilicon channel 454. Materials other than polysilicon can also be used. Note that vertical polysilicon channel 454 connects to the bit line. Surrounding vertical polysilicon channel 454 is a tunneling dielectric 456. In one embodiment, tunneling dielectric 456 has an oxide-nitride-oxide (ONO) structure. Surrounding tunneling dielectric 456 is charge trapping layer 458, such as (for example) a specially formulated silicon nitride that increases trap density.

FIG. 4E depicts dielectric layers DLL11, DLL12, DLL13, DLL14 and DLL15, as well as word line layers WLL27, WLL28, WLL29, WLL30, and WLL31. Each of the word line layers includes a word line region 460 surrounded by an aluminum oxide layer 462, which is surrounded by a blocking oxide ($SiO_2$) layer 464. The physical interaction of the word line layers with the vertical column forms the memory cells. Thus, a memory cell, in one embodiment, comprises vertical polysilicon channel 454, tunneling dielectric 456, charge trapping layer 458, blocking oxide layer 464, aluminum oxide layer 462 and word line region 460.

For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5. In other architectures, a memory cell may have a different structure; however, the memory cell would still be the storage unit.

When a memory cell is programmed, electrons are stored in a portion of charge trapping layer 458 which is associated with the memory cell. These electrons are drawn into charge trapping layer 458 from vertical polysilicon channel 454, through tunneling layer 458, in response to an appropriate voltage on word line region 460. The threshold voltage (Vth) of a memory cell is increased in proportion to the amount of stored charge. During an erase operation, the electrons return to the channel or holes recombine with electrons.

Referring again to FIG. 4C, each of vertical columns 432 and 434 is a NAND string disposed above and coupled via source select layers SGS1 and SGS2 to a source line SL. In particular, bottom portions of the NAND strings are in electrical contact with source line SL, and the configuration depicted in FIG. 4C is sometimes referred to as a bottom source line contact configuration. As the height of vertical columns 432 and 434 increases with technology scaling, implementing memory structures with a bottom source configuration, such as depicted in FIG. 4C becomes technically challenging. In particular, etching the bottom portion of each memory hole becomes increasingly difficult as the memory hole aspect ratio increases.

Figure 5A:
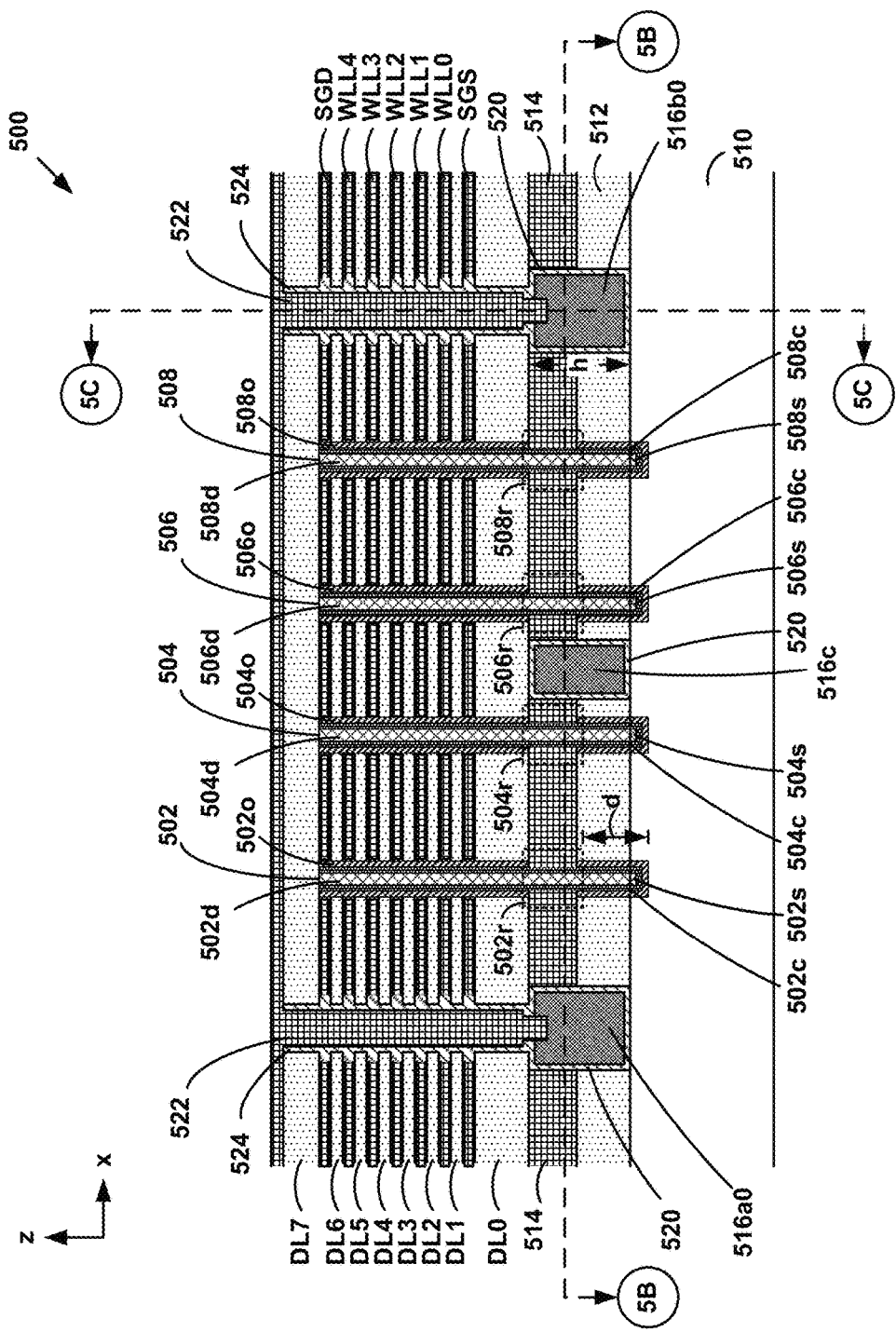
FIGS. 5A-5C are cross-sectional views of an embodiment of a memory structure.
Figure 5B:
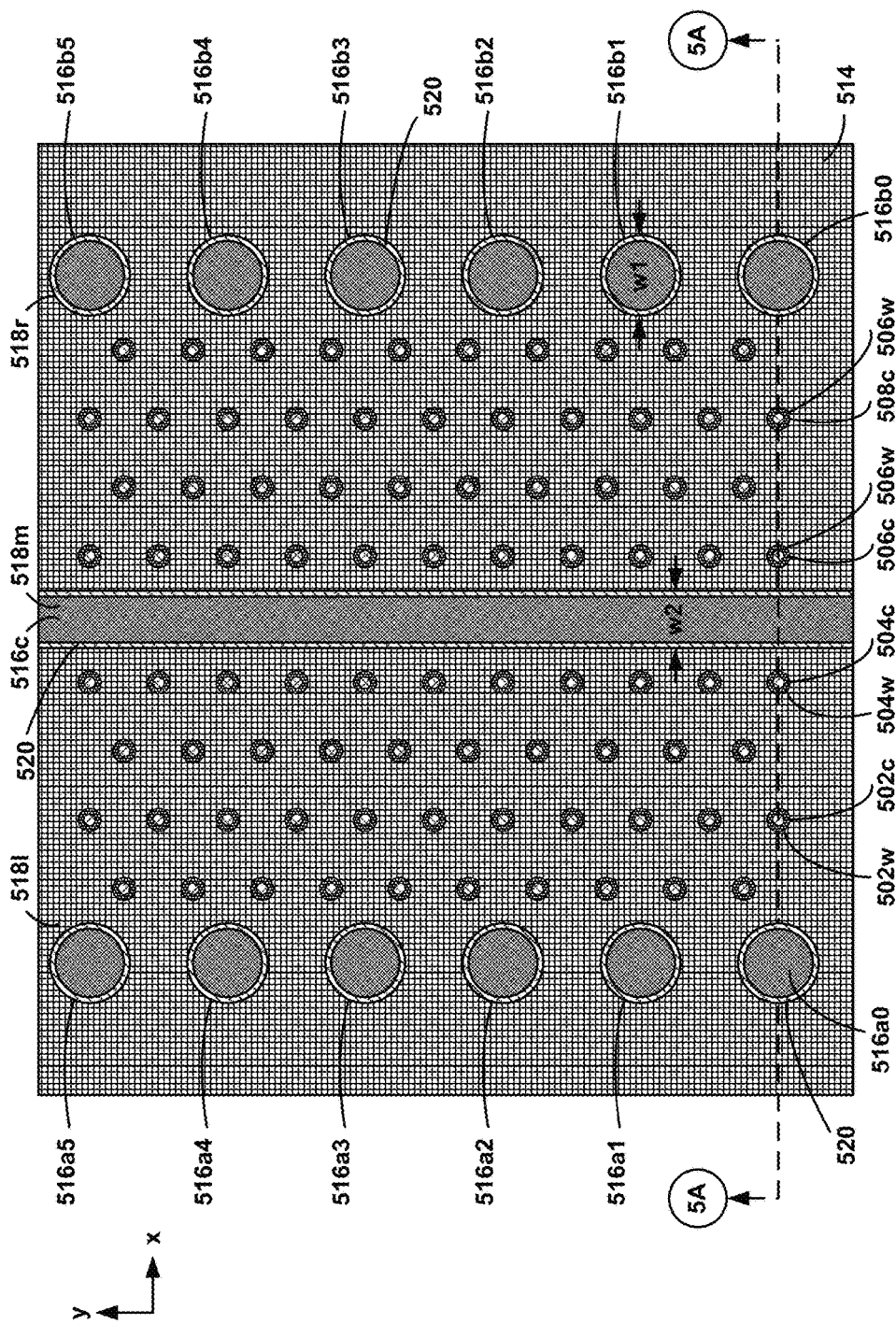
Figure 5C:
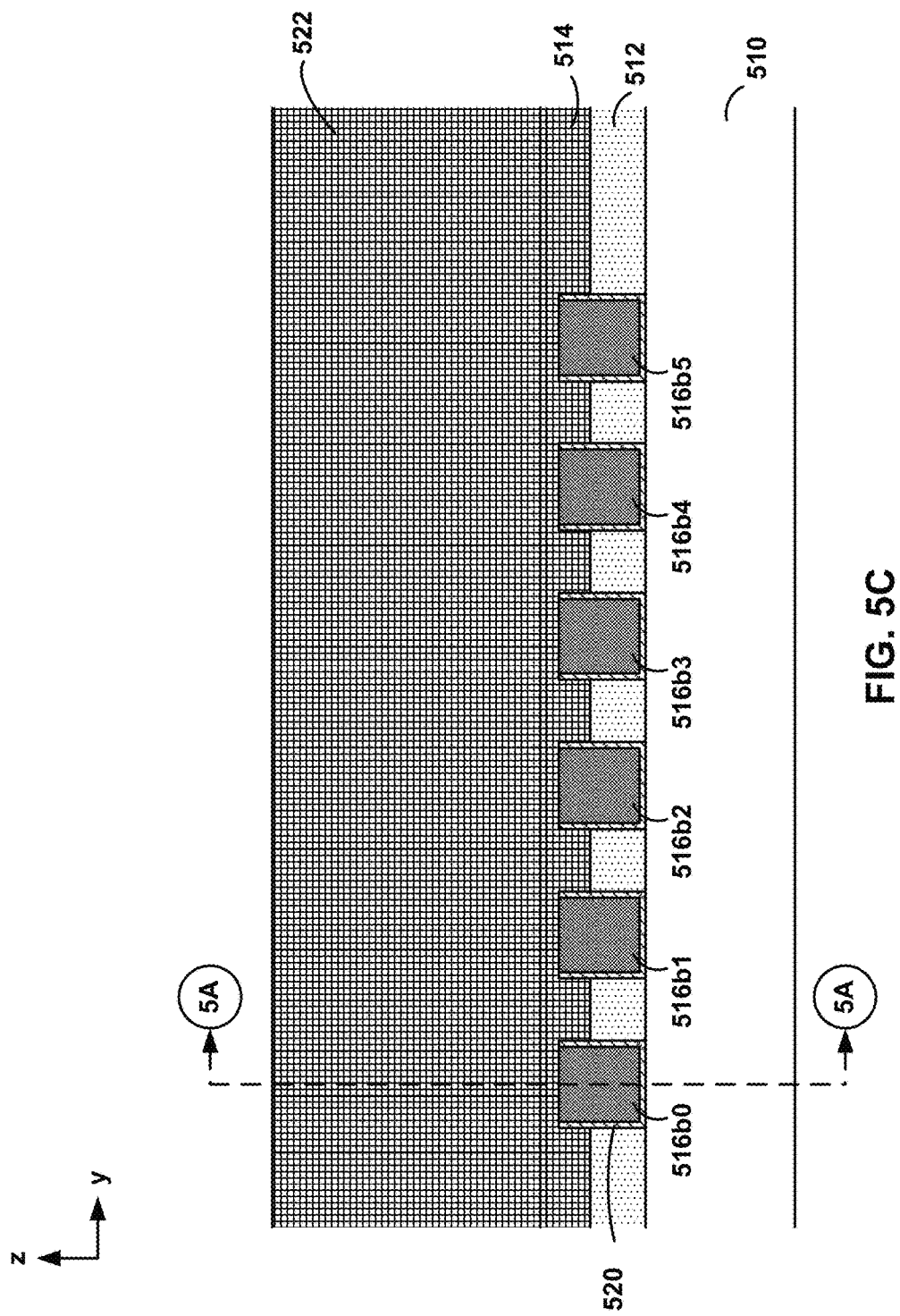
Figure 612:
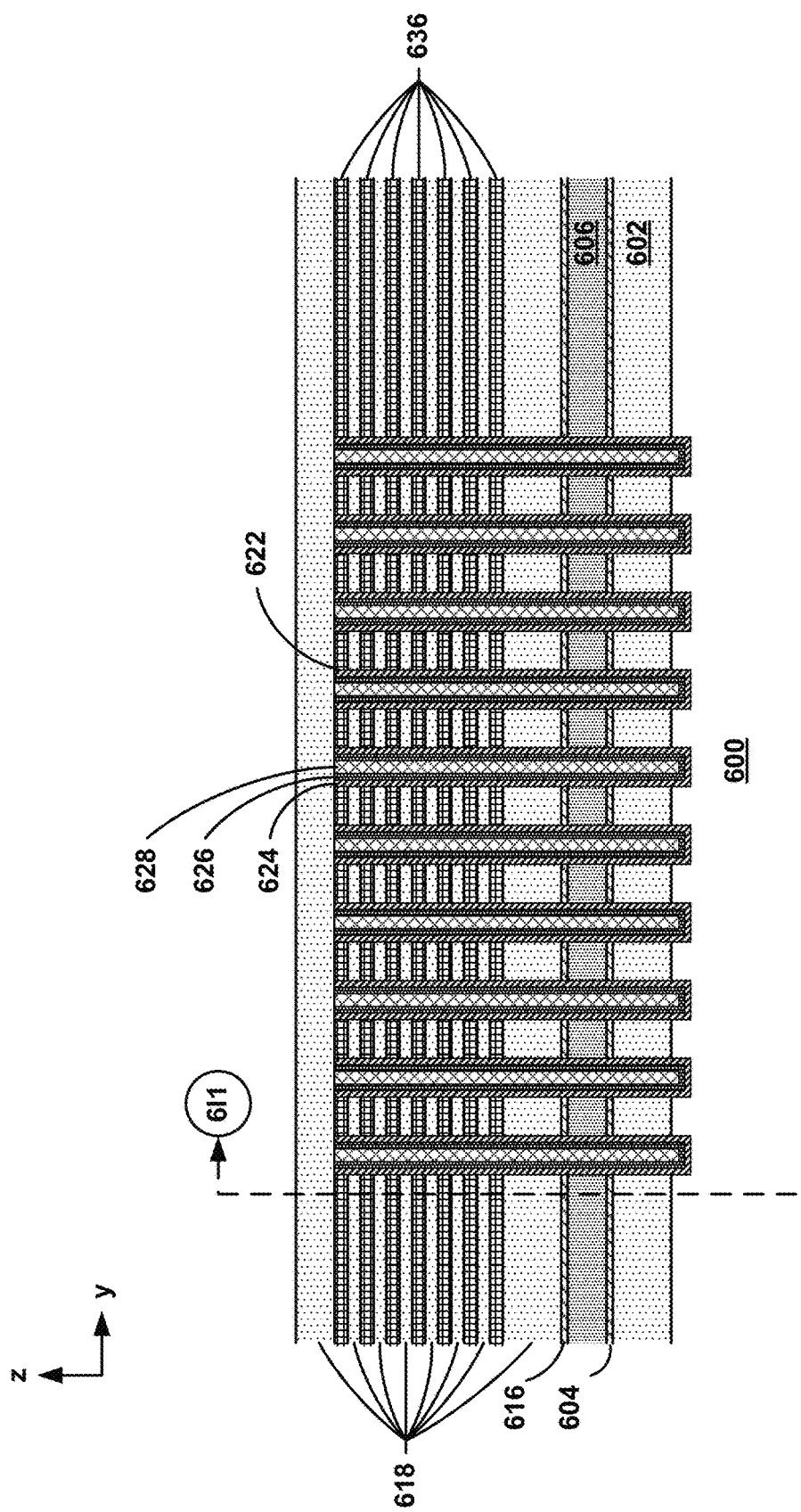

FIGS. 5A-5C are cross-sectional views of an embodiment of a three-dimensional stacked non-volatile memory structure 500 that includes an array of NAND strings, including NAND strings 502, 504, 506 and 508 disposed above a substrate 510. Each of NAND strings 502, 504, 506 and 508 has a corresponding drain end 502d, 504d, 506d and 508d, respectively, at a top of the stack, and a corresponding source end 502s, 504s, 506s and 508s, respectively, at a bottom of the stack.

NAND strings 502, 504, 506 and 508 include conductive layers (SGD, WLL0-WLL4, and SGS) and dielectric layers (DL0-DL7). Each of NAND strings 502, 504, 506 and 508 also has a corresponding vertical polysilicon channel 502c, 504c, 506c and 508c, respectively. Portions of each vertical polysilicon channel 502c, 504c, 506c and 508c are surrounded by a corresponding outer layer 502o, 504o, 506o and 508o, respectively, which may include one or more layers, such as tunneling dielectric 456 and charge trapping layer 458 of FIG. 4E. To simplify the drawings, each of outer layers 502o, 504o, 506o and 508o is depicted as a single layer.

Each of NAND strings 502, 504, 506 and 508 includes a corresponding region 502r, 504r, 506r and 508r, respectively, in which outer layers 502o, 504o, 506o and 508o, respectively, have been removed from vertical polysilicon channels 502c, 504c, 506c and 508c, respectively. In regions 502r, 504r, 506r and 508r, vertical polysilicon channels 502c, 504c, 506c and 508c, respectively have peripheral exteriors 502w, 504w, 506w and 508w, respectively. In an embodiment, regions 502r, 504r, 506r and 508r, are located at a distance d above a lower end of NAND strings 502, 504, 506 and 508, respectively. Distance d may be between about 250 angstroms and about 2500 angstroms, although other distances may be used.

A dielectric material layer 512, such as $SiO_2$, is disposed on substrate 510, and a source line 514, such as tungsten, is disposed on dielectric material layer 512. A memory hole extends through the stack of alternating conductive and dielectric layers. In an embodiment, the memory hole also extends through source line 514. A NAND string is then formed by filling the memory hole with materials including a charge-trapping layer to create a vertical column of memory cells. A straight NAND string extends in one memory hole.

Peripheral exteriors 502w, 504w, 506w and 508w of vertical polysilicon channels 502c, 504c, 506c and 508c, respectively, in regions 502r, 504r, 506r and 508r, respectively, above a lower end of the NAND strings are in physical and electrical contact with source line 514. In this regard, the configuration of memory structure 500 depicted in FIGS. 5A-5C is sometimes referred to as a side source line contact configuration because source line 514 contacts peripheral exteriors of the vertical polysilicon channels of the NAND strings. As used herein, source line 514 is also referred to as side source line 514 to indicate that side source line 514 electrically contacts peripheral exteriors 502w, 504w, 506w and 508w of vertical polysilicon channels 502c, 504c, 506c and 508c respectively.

As described above, outer layers 502o, 504o, 506o and 508o must be removed from regions 502r, 504r, 506r and 508r, respectively, of NAND strings 502, 504, 506 and 508, respectively, leaving peripheral exteriors 502w, 504w, 506w and 508w of vertical polysilicon channels 502c, 504c, 506c and 508c, respectively, in contact with side source line 514. Without the additional structural support provided by outer layers 502o, 504o, 506o and 508o, the structure of NAND strings 502, 504, 506 and 508 could be unstable during the processing steps used to fabricate memory structure 500.

To avoid this potential instability, in an embodiment memory structure 500 includes one or more mechanical support elements disposed adjacent the array of NAND strings of memory structure 500. In an embodiment, memory structure 500 includes a first set of mechanical support elements 516a0, 516a1, . . . , 516a5 disposed at a first region 518l of memory structure 500, a second set of mechanical support elements 516b0, 516b1, . . . , 516b5 disposed at a second region 518r of memory structure 500, and a third mechanical support element 516c disposed at a third region 518m of memory structure 500. In an embodiment, third mechanical support structure 516c is a single element. In other embodiments, third mechanical support structure 516c may include multiple elements. More or fewer than three sets of mechanical support elements may be used.

In an embodiment, first region 518l may be a first peripheral region of the array of NAND strings of memory structure 500, second region 518r may be a second peripheral region of the array of NAND strings of memory structure 500, and third region 518m may be a central region of the array of NAND strings of memory structure 500. Persons of ordinary skill in the art will understand that mechanical support elements may be disposed at more or fewer than three regions of the array of NAND strings of memory structure 500.

In an embodiment, each of mechanical support elements 516a0 516a1, . . . , 516a5 and mechanical support elements 516b0, 516b1, . . . , 516b5 has a cylindrical shape. Persons of ordinary skill in the art will understand that mechanical support elements 516a0, 516a1, . . . , 516a5 and mechanical support elements 516b0, 516b1, . . . , 516b5 may have shapes other than cylindrical. In addition, although twelve mechanical support elements 516a0, 516a1, . . . , 516a5 and mechanical support elements 516b0, 516b1, . . . , 516b5 are shown in FIG. 5B, more or fewer than twelve mechanical support elements may be used.

In an embodiment, each of mechanical support elements 516a0, 516a1, . . . , 516a5, 516b0, 516b1, . . . , 516b5, and 516c is polysilicon surrounded by a dielectric layer 520, such as $Al_2O_3$, which electrically isolates the mechanical support element material from side source line 514 and substrate 510. Other materials may be used for mechanical support elements 516a0, 516a1, . . . , 516a5, 516b0, 516b1, . . . , 516b5, and 516c, and other dielectric materials may be used for dielectric layer 520.

In an embodiment, mechanical support elements 516a0, 516a1, . . . , 516a5, 516b0, 516b1, . . . , 516b5, and 516c are disposed on substrate 510 and extend to a height substantially equal to a height of top surface of side source line 514. In embodiments, each of mechanical support elements 516a0, 516a1, . . . , 516a5, 516b0, 516b1, . . . , 516b5, and 516c has a height h between about 500 angstroms and about 3500 angstroms, although other heights may be used. In embodiments, each of mechanical support elements 516a0, 516a1, . . . , 516a5, 516b0, and 516b1, . . . , 516b5 has a width w1 between about 1000 angstroms and about 5000 angstroms, although other widths may be used. In embodiments, mechanical support element 516c has a width w2 between about 1000 angstroms and about 5000 angstroms, although other widths may be used.

In an embodiment, memory structure 500 also may include vertical slot conductors 522, disposed on mechanical support elements 516a0, 516a1, . . . , 516a5, 516b0, and 516b1, . . . , 516b5. In an embodiment, vertical slot conductors 522 are tungsten, although other materials may be used. A dielectric liner 524, such as $Al_2O_3$, isolates vertical slot conductors 522 from Other materials may be used for dielectric liner 524. Vertical slot conductors 522 are electrically coupled to side source line 514, and provide a low-resistance electrical contact to side source line 514.

Referring now to FIGS. 6A1-6N2, an example method of forming a three-dimensional stacked non-volatile memory structure, such as memory structure 500 of FIGS. 5A-5C. With reference to FIGS. 6A1-6A2, substrate 600 is shown as having already undergone several processing steps. Substrate 600 may be any suitable substrate such as a silicon, germanium, silicon-germanium, undoped, doped, bulk, silicon-on-insulator (SOI) or other substrate with or without additional circuitry. For example, substrate 600 may include one or more n-well or p-well regions (not shown). Isolation layer 602 is formed above substrate 600. In some embodiments, isolation layer 602 may be a layer of silicon dioxide, silicon nitride, silicon oxynitride or any other suitable insulating layer.

Following formation of isolation layer 602, a first dielectric layer 604 is formed over isolation layer 602. First dielectric layer 604 may include any suitable dielectric material formed by any suitable method (e.g., CVD, PVD, etc.). In an embodiment, first dielectric layer 604 may comprise between about 50 angstroms and about 150 angstroms of $Al_2O_3$. Other dielectric materials and/or thicknesses may be used. In some embodiments, an adhesion layer (not shown), such as titanium nitride or other similar adhesion layer material, may be disposed between isolation layer 602 and first dielectric layer 604.

Following formation of first dielectric layer 604, a layer of sacrificial material layer 606 is formed over first dielectric layer 604. Sacrificial material layer 606 may include any suitable sacrificial material layer formed by any suitable method (e.g., CVD, PVD, etc.). Sacrificial material layer 606 may be a semiconductor material, such as silicon, such as amorphous silicon or polysilicon, or another semiconductor material, such as a group IV semiconductor, including silicon-germanium and germanium. Preferably, sacrificial material layer 606 comprises intrinsic or undoped (if the as-deposited material inherently has a low p-type or n-type conductivity) semiconductor material, such as intrinsic or undoped polysilicon or amorphous silicon. However, p-type or n-type doped semiconductor materials, such as lightly or heavily doped materials may also be used if desired. In an embodiment, sacrificial material layer 606 may comprise between about 250 angstroms and about 1000 angstroms of polysilicon. Other sacrificial material and/or thicknesses may be used.

Next, sacrificial material layer 606, first dielectric layer 604 and isolation layer 602 are patterned and etched, resulting in the structure shown in FIGS. 6B1-6B3. For example, sacrificial material layer 606, first dielectric layer 604 and isolation layer 602 are patterned and etched using conventional lithography techniques, with a soft or hard mask, and wet or dry etch processing. In an embodiment, sacrificial material layer 606, first dielectric layer 604 and isolation layer 602 are patterned and etched to form trench 608 and cavities 610. In an embodiment, cavities 610 have a cylindrical shape, although other shapes may be used. In an embodiment, trench 608 has a width wt of between about 1000 angstroms and about 5000 angstroms, and cavities 610 each have a diameter dc of between about 1000 angstroms and about 5000 angstroms, although other diameters may be used.

A second dielectric material layer 612 is conformally formed in trench 608 and cavities 610. For example, between about 50 angstroms and about 150 angstroms of $Al_2O_3$ may be deposited, resulting in the structure shown in FIGS. 6C1-6C2. Other dielectric materials such as silicon nitride, silicon oxynitride, high K dielectrics, etc., and/or other dielectric material layer thicknesses may be used.

A polysilicon layer 614 is formed over substrate 600 to fill trench 608 and cavities 610. For example, between about 2000 angstroms and about 15000 angstroms of polysilicon may be deposited on the substrate 600, resulting in the structure shown in FIGS. 6D1-6D2. Other materials such as silicon nitride, silicon oxynitride, and/or other dielectric materials and/or polymers with different thicknesses may be used.

Next, a chemical mechanical polishing or an etchback process is used to form a planar surface, and an etch stop layer 616 is formed over substrate 600, resulting in the structure shown in FIGS. 6E1-6E2. Etch stop layer 616 may include any suitable etch stop layer formed by any suitable method (e.g., CVD, PVD, etc.). In an embodiment, etch stop layer 616 may comprise between about 50 angstroms and about 150 angstroms of $Al_2O_3$. Other etch stop layer materials and/or thicknesses may be used.

Alternating layers of third dielectric material layer 618 and fourth dielectric material layer 620 are form over substrate 600, resulting in the structure shown in FIGS. 6F1-6F2 In an embodiment, third dielectric material layer 618 may be between about 200 angstroms and about 500 angstroms of $SiO_2$, and fourth dielectric material layer 620 may be between about 200 angstroms and about 500 angstroms of $Si_3N_4$. Other dielectric materials and/or thicknesses may be used.

Memory holes 622 are formed that extend through alternating layers of third dielectric material layer 618 and fourth dielectric material layer 620, etch stop layer 616, sacrificial material layer 606, first dielectric layer 604, isolation layer 602 and substrate 600, and material layers are formed on interior sidewalls and bottom surfaces of memory holes 622. Memory holes 622 may have a diameter of between about 500 angstroms and about 2000 angstroms, and a height of between about 20000 angstroms and about 50000 angstroms. Other diameters and heights may be used.

In an embodiment, NAND strings are formed in each of memory holes 622, with each NAND string including an outer layer 624, which may include one or more layers (not shown), such as tunneling dielectric 456 and charge trapping layer 458 of FIG. 4E, a vertical polysilicon channel 626 disposed on outer layer 624, and a dielectric core 628, such as $SiO_2$ or other dielectric material, resulting in the structure shown in FIGS. 6G1-6G3. Outer layer 624 may have a thickness of between about 50 angstroms and about 200 angstroms, vertical polysilicon channel 626 may have a thickness of between about 50 angstroms and about 200 angstroms, and dielectric core 628 may have a diameter of between about 100 angstroms and about 1900 angstroms, although other values may be used. In an embodiment, outer layer 624 has an oxide-nitride-oxide (ONO) structure, and may include an exterior charge trapping layer, such as a specially formulated silicon nitride that increases trap density.

Next, third dielectric material layers 618 and fourth dielectric material layers 620 are patterned and etched, resulting in the structure shown in FIGS. 6H1-6H3. For example, third dielectric material layers 618 and fourth dielectric material layers 620 are patterned and etched using conventional lithography techniques, with a soft or hard mask, and wet or dry etch processing. In an embodiment, third dielectric material layers 618 and fourth dielectric material layers 620 are patterned and etched to form slots 630. In an embodiment, slots 630 terminate on etch stop layer 616. In an embodiment, slots 630 has a width ws of between about 1000 angstroms and about 2000 angstroms, although other widths may be used.

Next, an etch is performed to remove fourth dielectric material layers 620 to form cavities 632, which are lined with barrier and seeding material layers 634, and conductive word line layers 636, such as tungsten, are formed on barrier and seeding material layers 634. Barrier and seeding material layers 634 and conductive word line layers 636 are etched back, resulting in the structure shown in FIGS. 6I1-6I2.

A fifth dielectric material layer 638, an oxide material layer 640 and a sixth dielectric material layer 642 are conformally formed in slots 630, resulting in the structure shown in FIGS. 6J1-6J3. For example, fifth dielectric material layer 638 may be between about 20 angstroms and about 100 angstroms of $Al_2O_3$, oxide material layer 640 may be between about 20 angstroms and about 200 angstroms of $SiO_2$, and sixth dielectric material layer 642 may be between about 20 angstroms and about 100 angstroms of $Al_2O_3$. Other materials and/or other material layer thicknesses may be used.

A reactive ion etch process in performed to etch fifth dielectric material layer 638, oxide material layer 640, sixth dielectric material layer 642 and etch stop layer 616 in slots 630, resulting in the structure shown in FIGS. 6K1-6K3. As a result of the etch, voids 642 are formed above sacrificial material layer 606.

Next, sacrificial material layer 606 is removed via voids 642, resulting in the structure shown in FIGS. 6L1-6L2. Regions 644 remain in the spaces formerly occupied by sacrificial material layer 606.

Next, portions of outer layers 624 of the NAND strings formed in memory holes 622 are removed in regions 644, leaving peripheral exteriors of vertical polysilicon channels 626 exposed. In the process or removing portions of outer layers 624, oxide material layer 640 also is removed from slots 630, resulting in the structure shown in FIGS. 6M1-6M2.

Finally, a conductive material, such as tungsten is deposited over substrate 600, filling slots 630 to form vertical slot conductors 646 and filling regions 644 to form side source line 648, resulting in the structure shown in FIGS. 5N1-5N2. As is visible in FIGS. 5N1-5N2, peripheral exteriors of vertical polysilicon channels 626 are in physical and electrical contact with side source line 648. In addition, vertical slot conductors 646 are electrically coupled to side source line 648, and provide a low-resistance electrical contact to side source line 648.

One embodiment includes a method of fabricating a monolithic three dimensional memory structure. The method includes forming a stack of alternating word line and dielectric layers above a substrate, forming a source line above the substrate, forming a memory hole extending through the alternating word line and dielectric layers and the source line, and forming a mechanical support element on the substrate adjacent to the memory hole.

One embodiment includes a method of forming a three-dimensional stacked non-volatile memory structure. The method includes forming a source line above a substrate, forming a stack of alternating word line and dielectric layers above the substrate, forming a plurality of NAND strings of memory cells in memory holes which extend through the source line and the alternating word line and dielectric layers, each memory cell including a control gate formed by one of the word line layers, and forming a mechanical support element on the substrate adjacent the plurality of NAND strings.

One embodiment includes a three-dimensional stacked non-volatile memory structure that includes a source line disposed above a substrate, a stack disposed above the substrate, the stack comprising alternating word line and dielectric layers, a plurality of NAND strings of memory cells formed in memory holes which extend through alternating word line and dielectric layers, each NAND string comprising a vertical channel having peripheral exterior above a bottom end of the NAND string in contact with the source line, and a mechanical support element disposed on the substrate adjacent the plurality of NAND strings.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. A three-dimensional stacked non-volatile memory structure comprising:
   a source line disposed above a substrate;
   a stack disposed above the substrate, the stack comprising alternating word line and dielectric layers;
   a plurality of NAND strings of memory cells formed in memory holes which extend through the source line and the alternating word line and dielectric layers, each memory cell comprising a control gate formed by one of the word line layers; and
   a mechanical support element disposed on the substrate adjacent the plurality of NAND strings, the mechanical support element extending through the source line.

2. The three-dimensional stacked non-volatile memory structure of claim 1, wherein the mechanical support element comprises a plurality of mechanical support elements.

3. The three-dimensional stacked non-volatile memory structure of claim 2, wherein the plurality of mechanical support elements is disposed along a peripheral region of the plurality of NAND strings.

4. The three-dimensional stacked non-volatile memory structure of claim 1, wherein the mechanical support element comprises a first set of mechanical support elements disposed at a first region of the memory structure, a second set of mechanical support elements disposed at a second region of the memory structure, and a third mechanical support element disposed at a third region of the memory structure.

5. The three-dimensional stacked non-volatile memory structure of claim 4, wherein the first region comprises a first peripheral region of the memory structure, the second region comprises a second peripheral region of the memory structure, and the third region comprises a central region of the memory structure.

6. The three-dimensional stacked non-volatile memory structure of claim 1, wherein the mechanical support element extends to a height substantially equal to a height of a top surface of the source line.

7. The three-dimensional stacked non-volatile memory structure of claim 1, wherein the mechanical support element has a height between about 500 angstroms and about 3500 angstroms.

8. The three-dimensional stacked non-volatile memory structure of claim 1, wherein the mechanical support element comprises polysilicon.

9. The three-dimensional stacked non-volatile memory structure of claim 1, wherein each of the NAND strings comprises a vertical channel comprising a peripheral exterior in contact with the source line.

10. The three-dimensional stacked non-volatile memory structure of claim 9, wherein the vertical channel comprises polysilicon.

* * * * *